(12) United States Patent
Lamotte et al.

(10) Patent No.: US 7,501,155 B2
(45) Date of Patent: *Mar. 10, 2009

(54) MANUFACTURING METHOD OF PHOSPHOR OR SCINTILLATOR SHEETS AND PANELS SUITABLE FOR USE IN A SCANNING APPARATUS

(75) Inventors: Johan Lamotte, Rotselaar (BE); Guido Verreyken, Edegem (BE); Paul Leblans, Kontich (BE)

(73) Assignee: AGFA Healthcare, Mortsel (BE)

( * ) Notice: Subject to any disclaimer, the term of this patent is extended or adjusted under 35 U.S.C. 154(b) by 879 days.

This patent is subject to a terminal disclaimer.

(21) Appl. No.: 10/805,854

(22) Filed: Mar. 22, 2004

(65) Prior Publication Data

US 2004/0219289 A1    Nov. 4, 2004

Related U.S. Application Data

(60) Provisional application No. 60/460,167, filed on Apr. 2, 2003.

(30) Foreign Application Priority Data

Mar. 20, 2003    (EP) .................................. 03100723

(51) Int. Cl.
*C23C 16/00* (2006.01)
*B05D 5/00* (2006.01)
(52) U.S. Cl. ...................... 427/255.5; 427/64; 427/124; 427/251; 427/255.7; 427/402
(58) Field of Classification Search ............. 427/68–70, 427/255.5, 248.1
See application file for complete search history.

(56) References Cited

U.S. PATENT DOCUMENTS

| 3,838,273 | A | | 9/1974 | Cusano ................. 250/213 VT |
|---|---|---|---|---|
| 3,859,527 | A | | 1/1975 | Luckey ....................... 250/327 |
| 4,449,478 | A | | 5/1984 | Kraus ......................... 118/720 |
| 4,741,993 | A | * | 5/1988 | Kano et al. .................. 430/536 |
| 4,769,549 | A | | 9/1988 | Tsuchino et al. ......... 250/484.1 |
| 4,983,848 | A | * | 1/1991 | Hunter .................... 250/483.1 |
| 5,055,681 | A | | 10/1991 | Tsuchino et al. ......... 250/327.2 |
| 5,460,853 | A | * | 10/1995 | Hintz et al. .............. 427/255.5 |
| 6,402,905 | B1 | | 6/2002 | Baldwin et al. ........ 204/192.13 |

(Continued)

FOREIGN PATENT DOCUMENTS

EP    0 574 020    12/1993

(Continued)

*Primary Examiner*—Timothy H Meeks
*Assistant Examiner*—David Turocy
(74) *Attorney, Agent, or Firm*—Joseph T. Guy; Nexsen Pruet, LLC

(57) ABSTRACT

In a method for coating a phosphor or a scintillator layer onto a flexible substrate, within a sealed zone maintained under vacuum conditions, by the step of vapor deposition, said phosphor or scintillator layer is, continuously or discontinuously, deposited onto said substrate, and said substrate is deformed at least before, during or after said step of vapor deposition, in order to provide the manufacturer, by a process of exceptionally high yield, with large deposited phosphor or a scintillator sheets having constant speed and image quality properties, further offering availability of all formats as desired for screens, plates or panels ready-for-use in a scanning apparatus in computed radiography, screen/film radiography and direct radiography.

160 Claims, 6 Drawing Sheets

U.S. PATENT DOCUMENTS 7,141,135 B2 * 11/2006 Guido et al. ................ 156/250
2003/0024479 A1 * 2/2003 Kashiwaya et al. ......... 118/726

FOREIGN PATENT DOCUMENTS

| EP | 0 003 458 | 7/2001 |
| EP | 1113458 A1 * | 7/2001 |
| EP | 1286364 A2 * | 2/2003 |
| GB | 2339800 | 2/2000 |
| GB | 2339800 A * | 2/2000 |
| WO | 01 03156 | 11/2001 |

* cited by examiner

MANUFACTURING METHOD OF PHOSPHOR OR SCINTILLATOR SHEETS AND PANELS SUITABLE FOR USE IN A SCANNING APPARATUS

The application claims the benefit of U.S. provisional application No. 60/460,167 filed Apr. 2, 2003.

FIELD OF THE INVENTION

The present invention relates to a particular method of coating a layer from a vapor flow of raw materials on a flexible substrate. More particularly the present invention relates to the manufacturing or production of scintillator or phosphor sheets, used in screens, panels or plates suitable for use in high energy radiation detection and imaging and, more particularly, in computed radiography, screen/film radiography and direct radiography.

BACKGROUND OF THE INVENTION

In radiography the interior of objects is reproduced by means of penetrating radiation, which is high energy radiation also known as ionizing radiation belonging to the class of X-rays, γ-rays and high-energy elementary particle rays, e.g. β-rays, electron beam or neutron radiation.

For the conversion of penetrating radiation into visible light and/or ultraviolet radiation "luminescent" substances, called "phosphors", are used. Cathodoluminescent phosphors employed e.g. in CRT screens exhibit two related luminescent characteristics: fluorescence and phosphorescence. Fluorescence is the luminescent build-up or emission of light released from the phosphor during the time of electron beam excitation. Phosphorescence is the emission of light from the phosphor occurring after the cessation of electron beam excitation. The duration of phosphorescence, or rate of decay of afterglow, is denoted as persistence, usually expressed as a measurement of time required for the phosphorescence in order to reduce or decay to a ten percent level of steady state fluorescent brightness.

In known X-ray image intensifiers for example as disclosed in U.S. Pat. No. 3,838,273, the input screen comprises a substrate such as glass or aluminum on which is deposited an X-ray sensitive radiation conversion layer, commonly referred to as a fluorescence layer or scintillator.

In a conventional radiographic system an X-ray radiograph is obtained by X-rays transmitted imagewise through an object and converted into light of corresponding intensity in a so-called intensifying screen (X-ray conversion screen) wherein phosphor particles absorb the transmitted X-rays and convert them into visible light and/or ultraviolet radiation to which a photographic film is more sensitive than to the direct impact of X-rays. In practice the light emitted imagewise by said screen irradiates a contacting photographic silver halide emulsion layer film which after exposure is developed to form therein a silver image in conformity with the X-ray image.

As described e.g. in U.S. Pat. No. 3,859,527 an X-ray recording system has meanwhile been developed wherein photostimulable storage phosphors are used, said phosphors having, in addition to their immediate light emission (prompt emission) on X-ray irradiation, the property to store temporarily a large part of the X-ray energy. Said energy is set free by photostimulation in the form of fluorescent light different in wavelength from the light used in the photostimulation step. In said X-ray recording system the light emitted on photostimulation is detected photoelectronically and transformed into sequential electrical signals. A storage screen or panel coated with such phosphors is exposed to an incident pattern-wise modulated X-ray beam and as a result thereof energy is temporarily stored in the coated storage phospors, corresponding with the X-ray radiation pattern. At some interval after the exposure, a beam of visible or infra-red light scans the panel in order to stimulate the release of stored energy as light that is detected and converted to sequential electrical signals which are processed to produce a visible image. Stimulation light can be transformed into an electric signal by making use of a photoelectric conversion element such as e.g. a photo-multiplier. It is clear that the phosphor should store as much as possible of the incident X-ray energy and emit as little as possible of the stored energy until stimulated by the scanning beam. This is called "digital radiography" or "computed radiography" (CR).

Recently, in the hospitals the tendency is increasing to obtain X-ray images on computer monitor immediately after X-ray exposure of the patient. By storing and transmitting that digitized information, efficiency and speed of diagnosis is enhanced. Accordingly "direct radiography" providing directly digital diagnostic X-ray images, after exposure of an adapted detector panel in a radiographic apparatus, becomes preferred instead of the conventional screen/film system. The X-ray quanta are transformed into electric signals by making use of a solid-state flat detector as "image pick-up" element. Such a flat detector is commonly called a "flat panel detector" and is two-dimensionally arranged. Making use therein of a photoconductive material as a detecting means, such as a-Se, in which the negative electrical charge of an electron and the positive electrical charge of a hole are generated by the X-ray energy, said X-ray energy is directly converted into those separated electrical charges. The electrical charge thus obtained is read out as an electric signal by the read-out element, two-dimensionally arranged in a fine area unit.

Further on an indirect type flat panel detector is known, in which the X-ray energy is converted into light by a scintillator, and in which the converted light is converted into the electric charge by the photoelectric conversion element such as a-Si two-dimensionally arranged in a fine area unit. The electrical charge is read out again as an electric signal by the photoelectric conversion read-out element, two-dimensionally arranged in a fine area unit.

Moreover a direct radiography detector is known in which the X-ray energy is converted into light by a scintillator, and wherein the converted light is projected on one or more CCD or CMOS sensors which are arranged matrix-wise in the same plane, through a converging body such as a lens or optical fiber. In the inside of the CCD or CMOS sensor, via photoelectric conversion, and charge-voltage conversion, an electric signal is obtained in every pixel. This type of detector is also defined, therefore, as a solid state plane detector.

The image quality that is produced by any radiographic system using phosphor screen or panel, and more particularly, within the scope of the present invention, in a digital radiographic system, largely depends upon the construction of the phosphor screen. Generally, the thinner a phosphor screen at a given amount of absorption of X-rays, the better the image quality will be. This means that the lower the ratio of binder to phosphor of a phosphor screen, the better the image quality, attainable with that screen or panel, will be. Optimum sharpness can thus be obtained when screens without any binder are used. Such screens can be produced, e.g., by physical vapor deposition, which may be thermal vapor deposition, sputtering, electron beam deposition or other of phosphor material on a substrate. Such screens can also be produced by chemical vapor deposition. However, this production method can not be used to produce high quality screens with every arbitrary phosphor available. The mentioned production method leads to the best results when phosphor crystals with high crystal symmetry and simple chemical composition are used. So in a preferred embodiment use of alkali metal halide phosphors in storage screens or panels is well known in the art of storage phosphor radiology and the high crystal symmetry of these phosphors makes it possible to provide structured, as well as binderless screens.

It has been disclosed that when binderless screens with an alkali halide phosphor are produced it is beneficial to have the phosphor crystals deposited as some kind of piles or pillar-shaped blocks, needles, tiles, etc., in order to increase the image quality that can be obtained when using such a screen. In U.S. Pat. No. 4,769,549 it is disclosed that the image quality of a binderless phosphor screen can be improved when the phosphor layer has a block structure, shaped in fine pillars. In U.S. Pat. No. 5,055,681 a storage phosphor screen comprising an alkali halide phosphor in a pile-like structure is disclosed. In EP-A 1 113 458 a phosphor panel provided with a selected vapor deposited CsBr:Eu phosphor layer is disclosed, wherein the binderless phosphor is present as fine needles in favor of an optimized image quality.

It is clear that, from a point of view of homogeneity of layer thickness and chemical composition of the scintillator, in favor of a constant speed, image quality and diagnostic reliability, it is of utmost importance to provide said constant composition and layer thickness over the whole two-dimensional panel surface in the production of the storage phosphor plates. A homogeneous coating profile should thus be strived for.

Manufacturing procedures making use of deposition techniques as in U.S. Pat. No. 4,449,478 wherein an arrangement for coating substrates in an apparatus for vacuum deposition comprises a rotatable substrate holding structure in a form of a plate, provide coated panels limited in number and in coated surface. Moreover, when square or rectangular panels are desired, quite a lot of expensive residue is created while not being deposited onto the plate, rotating with a circular symmetry above the vapor source. In addition, when depositing material from a fixed source onto such a rotating substrate, it is difficult to obtain a layer with a constant thickness. Circles on the substrate, having the rotation axis as centre will have identical deposition history. This creates a centro-symmetric thickness profile, which means that the thickness of the deposited layer is constant along neither of the sides of a rectangular substrate, unless special precautions are taken, e.g. use of a mask which will however lead to material losses.

Manufacturing procedures make use of e.g. deposition techniques as in U.S. application 2003/0024479, with an arrangement for coating rigid substrates, batch wise (plate per plate), in an apparatus for vacuum deposition. Such an apparatus comprises a substrate holder conveyed from a loading chamber to an unloading chamber by a conveying mechanism, and provides coated panels limited in process yield. Another batch process has been described in U.S. Pat. No. 6,402,905, where commonly a vapor deposition coating process is applied by which vapor is deposited onto a substrate that rotates around one axis that is perpendicular to the deposition area, as commonly applied in the state of the art, and wherein a system and method for controlling and compensating unevenness of the deposition thickness distribution on a substrate has been described.

In such a batch process a coating failure will generally lead to the complete loss of a panel. Moreover there will always be a high loss of raw materials in such batch processes. Lack of deformability of the substrate also limits the format of the coating of a phosphor or scintillator layer on a substrate to the largest cross section of the vacuum deposition chamber.

OBJECTS AND SUMMARY OF THE INVENTION

Therefore it is an object of the present invention to provide a method of producing phosphor or scintillator plates or panels, wherein the layer thickness in the manufacturing process is constant over large surface areas.

It is another object of the present invention to provide phosphor plates of differing tailor-made sizes, all resulting from the same deposition process, wherein said plates moreover show homogeneity in speed and sharpness over the whole area of the plates, irrespective of their dimensions.

A still further object of the present invention is to provide a method of producing phosphor plates or panels on a substrate with a surface area that is much larger than the area of a single plate or panel manufactured in a batch process, e.g. preferably more then 1.5 times larger, more preferably more then 5 times larger and even most preferably more then 10 times larger.

Still another object is related with the yield of the process, thereby obviating undesired losses of expensive raw materials.

Furtheron it is still another object of the present invention to provide a method of producing phosphor or scintillator plates or panels on very large flexible substrates, cutting these large areas in desired formats and protecting these flexible plates or panels against physical, chemical or mechanical damage, or a combination thereof.

Other objects will become apparent from the description hereinafter.

The above-mentioned advantageous effects have been advantageously realized by a particular manufacturing method having the specific features set out in claim 1. Specific features for preferred embodiments of the invention are set out in the dependent claims and in the drawings.

Further advantages and embodiments of the present invention will become apparent from the following description and drawings.

BRIEF DESCRIPTION OF THE DRAWINGS

Following Figures represent an illustration of different embodiments of configurations related with the substrate to be coated and the apparatus wherein the coating process takes place. It is clear that these Figures, showing preferred embodiments of the coating methods according to the present invention, are in no way limited thereto.

Optionally there can be a separation (15) between the evaporation part (18) and the heating part (19).

Figure 2:
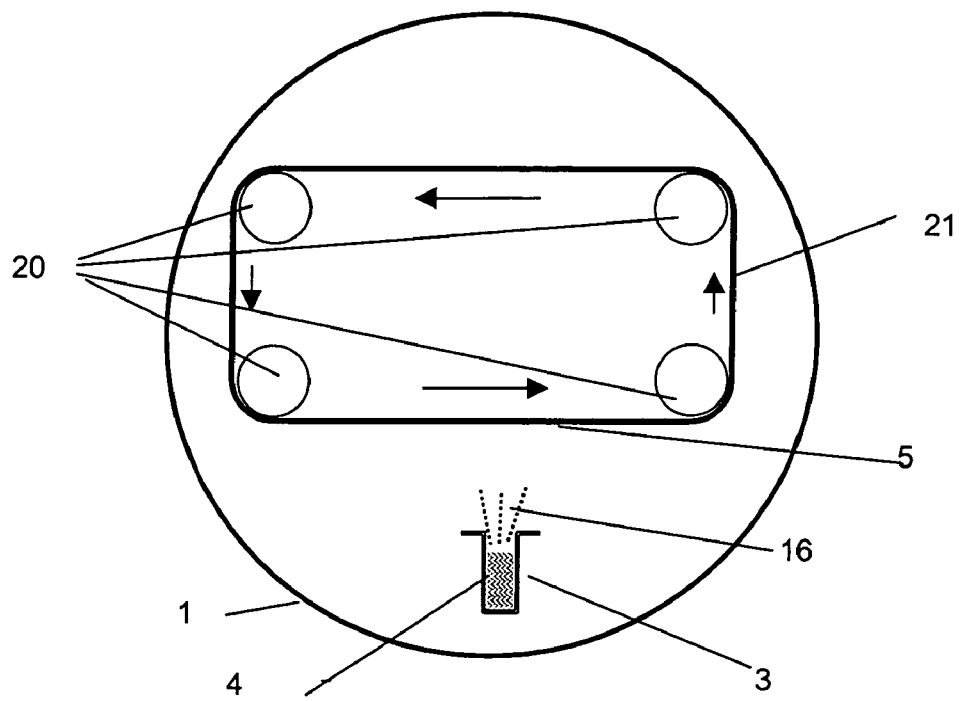

FIG. 2 shows vacuum chamber (1), a flexible sheet(S) that is stretched around four conveying rollers (20), moving continuously or discontinuously in a forward direction through a vapor stream (16), provided by the mixture of raw materials (4) present in the tray or boat (3) and heated to provide a vapor source generating said vapor stream (16), in order to provoke a phosphor layer to be deposited onto the flexible sheet (5) in one step (passage or transit through the vapor stream (16) in one step) or in several successive steps (more than one passage or transit through the vapor stream (16)) and wherein the flexible sheet (5) does not leave the vacuum chamber (1). The illustrated travelling pathway (21) of the flexible sheet (5) is not limitative. Another construction could be the use of smaller flexible sheets that are mounted on a flexible support material that is stretched around the conveying rollers (20).

Figure 3:
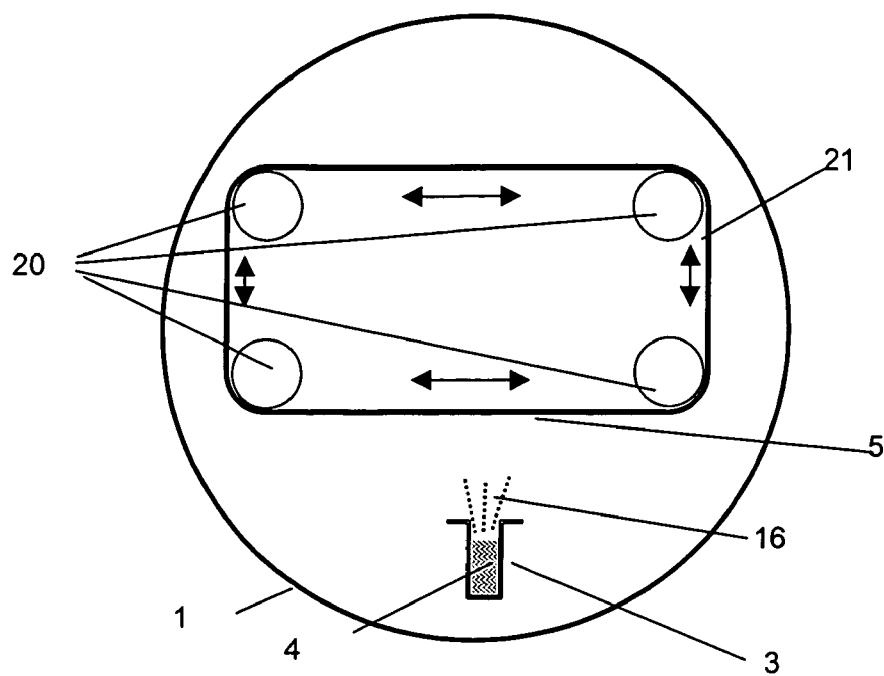

FIG. 3 shows vacuum chamber (1), a flexible sheet (5) that is stretched around four conveying rollers (20), moving successively in a forward and backward direction and continuously or discontinuously through a vapor stream (16), provided by the mixture of raw materials (4) present in the tray or boat (3) and heated to provide a vapor source generating said vapor stream (16), in order to provoke a phosphor layer to be deposited onto the flexible sheet (5) in several successive steps (more than one passage or transit through the vapor stream (16)) and wherein the flexible sheet (5) does not leave the vacuum chamber (1). The travelling pathway (21) of the flexible sheet (5) as represented in this FIG. 3 is not limitative. Another construction could be the use of smaller flexible sheets that are mounted on a flexible support material that is stretched around the conveying rollers (20).

Figure 4:
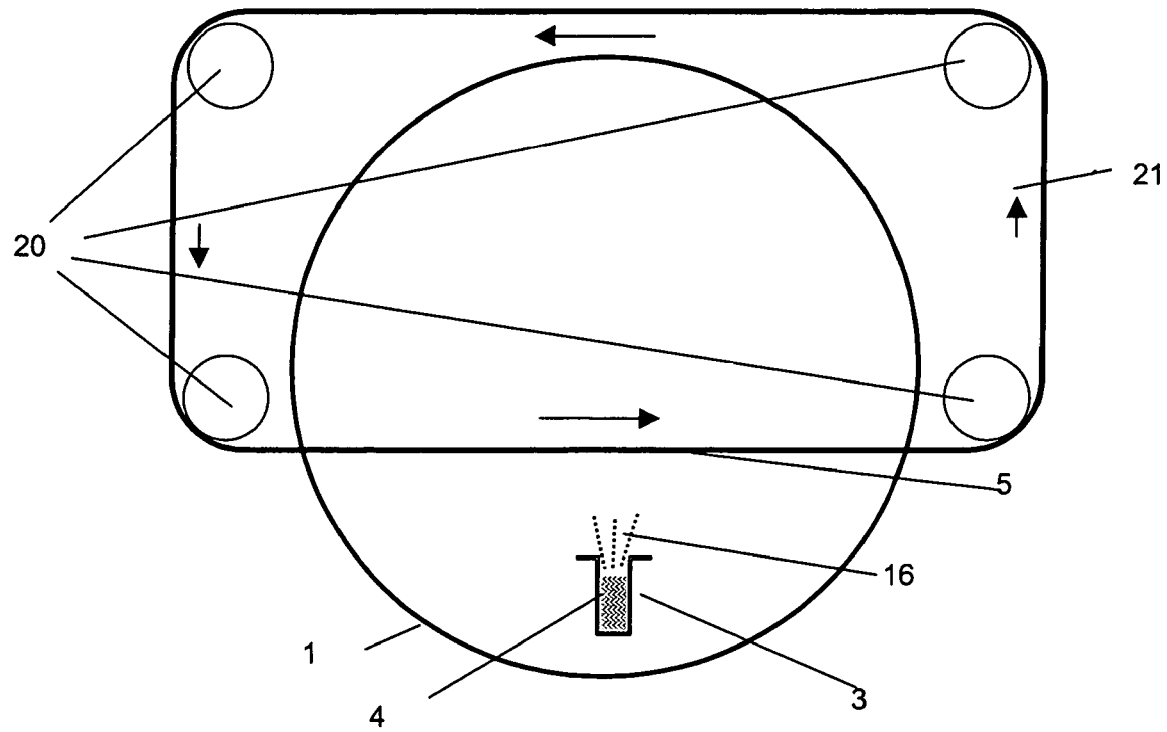

FIG. 4 shows vacuum chamber (1), a flexible sheet(5) that is stretched around four conveying rollers (20), moving continuously or discontinuously in a forward direction through a vapor stream (16) provided by the mixture of raw materials (4) present in the tray or boat (3) and heated to provide a vapor source generating said vapor stream (16), in order to provoke a phosphor layer to be deposited onto the flexible sheet (5), in one step (passage or transit through the vapor stream (16) in one step) or in several successive steps (more than one passage or transit through the vapor stream) and wherein the flexible sheet (5) leaves the vacuum chamber (1). The illustrated travelling pathway (21) of the flexible sheet (5) is not limitative. Another construction could be the use of smaller flexible sheets that are mounted on a flexible support material that is stretched around the conveying rollers (20).

Figure 5:
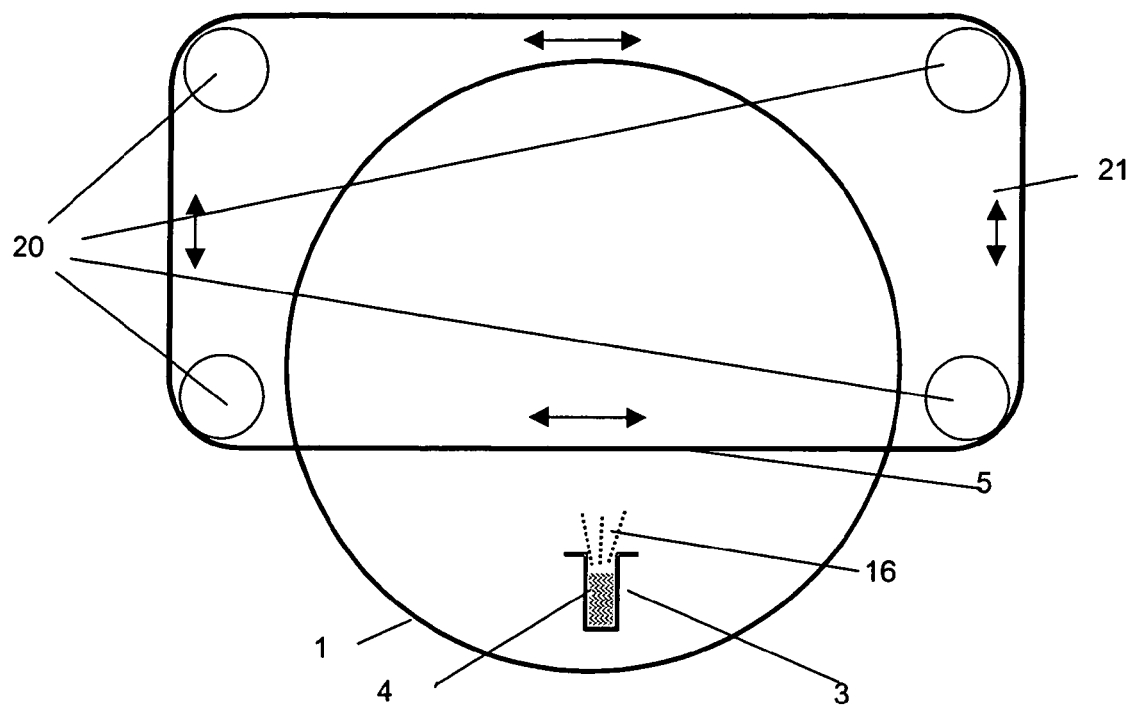

FIG. 5 shows vacuum chamber (1), a flexible sheet (5) that is stretched around four conveying rollers (20), moving successively in a forward and backward direction and continuously or discontinuously through a vapor stream (16) provided by the mixture of raw materials (4) present in the tray or boat (3) and heated to provide a vapor source generating said vapor stream (16), in order to provoke a phosphor layer be deposited onto the flexible sheet (5) in several successive steps (more than one transit or passage through the vapor stream) and wherein the flexible sheet (5) leaves the vacuum chamber (1). The illustrated travelling pathway (21) of the flexible sheet (5) is not limitative. Another construction could be the use of smaller flexible sheets that are mounted on a flexible support material that is stretched around the conveying rollers (20).

Figure 6:
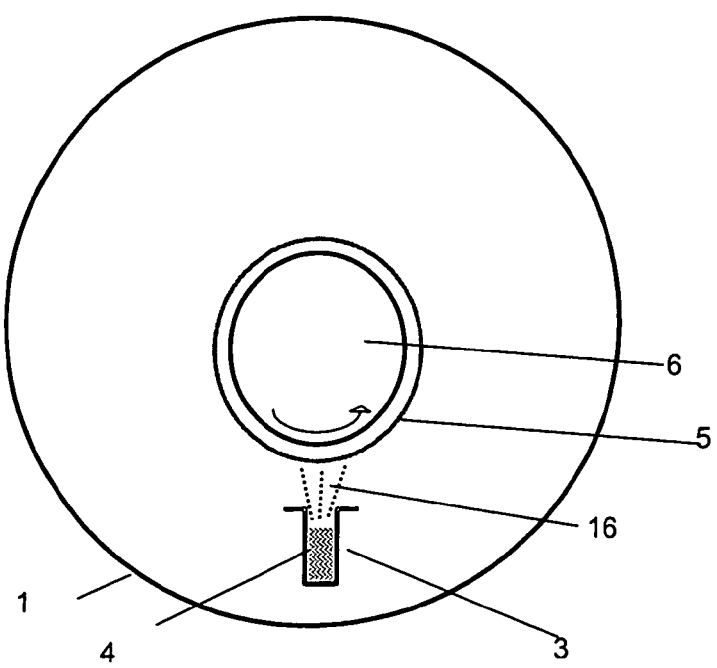

FIG. 6 shows a flexible sheet substrate (5) mounted around one rotating support roller (6), in a vacuum chamber (1), moving continuously or discontinuously in a forward (or backward) direction through a vapor stream (16) provided by the mixture of raw materials (4) present in the tray or boat (3) and heated to provide a vapor source generating said vapor stream (16), in order to provoke a phosphor layer to be deposited onto the sheet (5) in one step (one rotation) or in several successive steps (more rotations).

Figure 7:
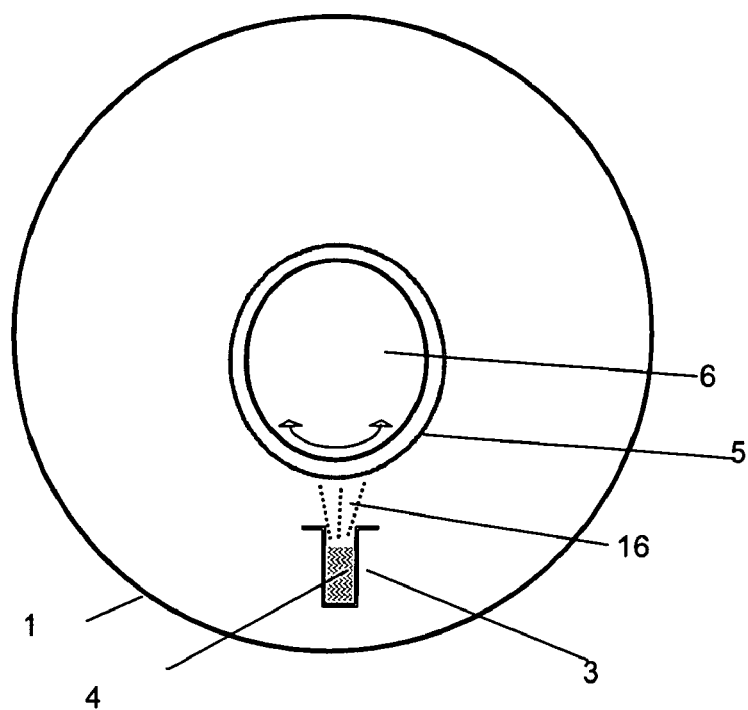

FIG. 7 shows a flexible sheet substrate (5) mounted around one rotating support roller (6), in a vacuum chamber (1), moving successively in a forward and backward direction and continuously or discontinuously through a vapor stream (16), provided by the mixture of raw materials (4) present in the tray or boat (3) and heated to provide a vapor source generating said vapor stream (16), in order to provoke a phosphor layer to be deposited onto the flexible sheet (5) in several successive steps.

Figure 8:
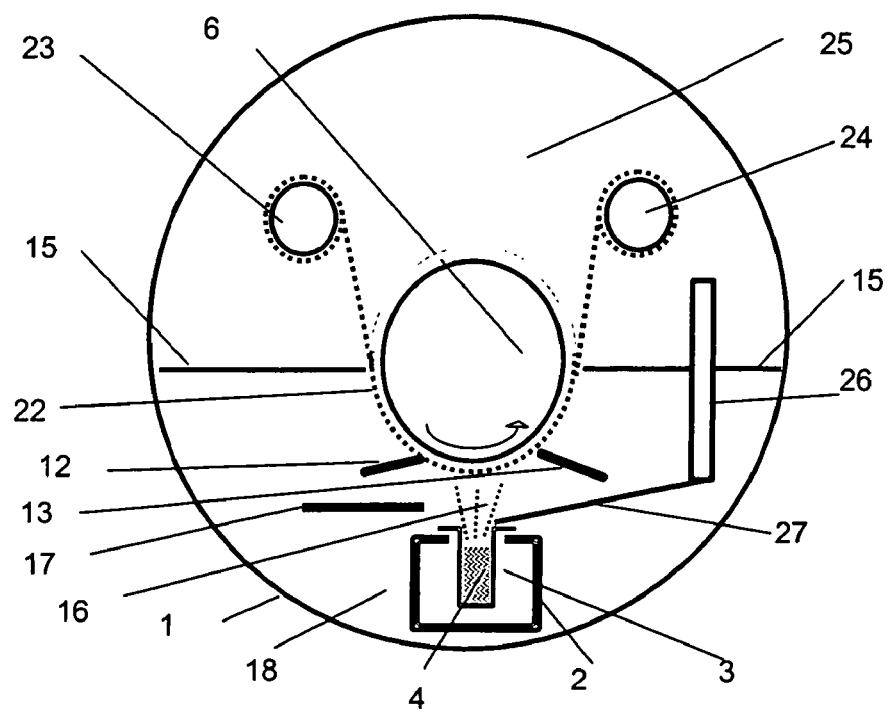

FIG. 8 shows a vacuum chamber (1) for vapor coating, wherein a roll supply of material (23) (unwinding roller) is fed out in continuous sheet or web form (22). The web is conveyed over a guiding roller (6) and collected on a winding roll (24). The continuous sheet form (22) or web is moving continuously or discontinuously in a forward direction through a vapor stream (16) provided by the mixture of raw materials (4) present in the tray or boat (3) and heated to provide a vapor source generating said vapor stream (16), in order to provoke a phosphor layer to be deposited onto the web (21) and wherein the unwinding roller (23) and the winding roller (24) are in the vacuum chamber (1). A cooled baffle (17) may be moved in order to shut off the surface to be coated from or in order to expose the surface to be coated to the vapor stream. Baffles (12) and (13) restrict vapor deposition to a selected part of web (22). Optionally there can be a separation by plates (15) between the evaporation part (18) and the winding part (25) in the vacuum chamber (1). Optionally, in the case that the raw materials get exhausted, a source of raw material supply (26) can add raw materials, with the aid of a guiding mechanism (27), to the site where it should be vaporized. Multiple sources may of course also be used.

Figure 9:
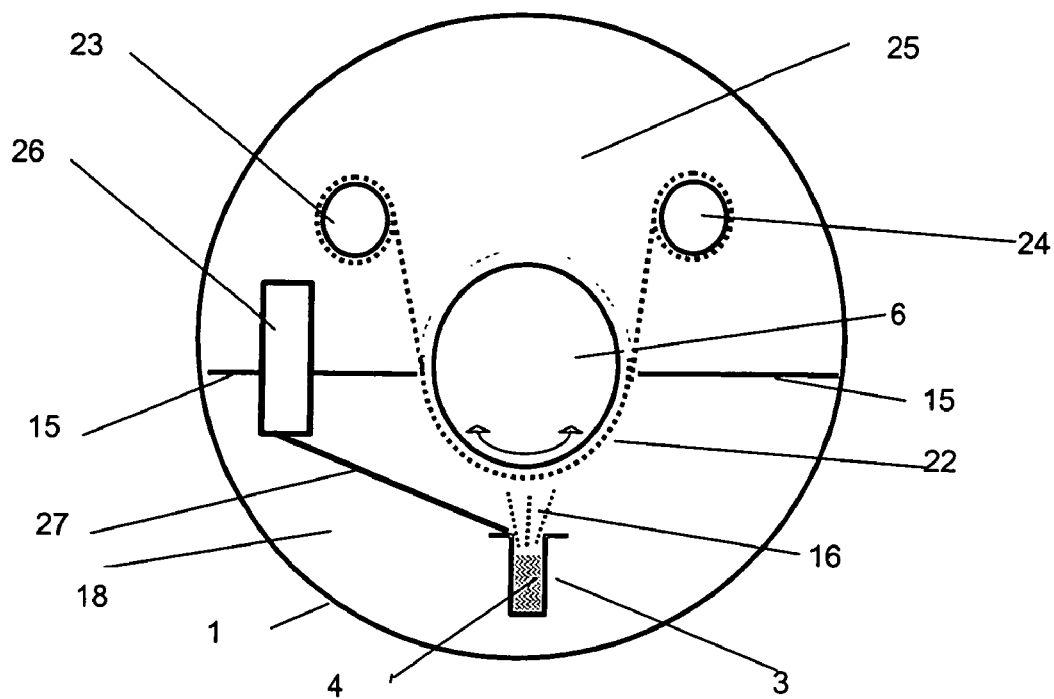

FIG. 9 is analogous with FIG. 8, but is different in that the continuous sheet form or web (22) is moving continuously or discontinuously in a successively forward and backward direction through a vapor stream (16), provided by the mixture of raw materials (4) present in the tray or boat (3) and heated to provide a vapor source generating said vapor stream (16), in order to provoke a phosphor layer to be deposited onto the support in successive steps and wherein the unwinding or supply roller (23) and the winding roller (24) are in the vacuum chamber (1).

Figure 10:
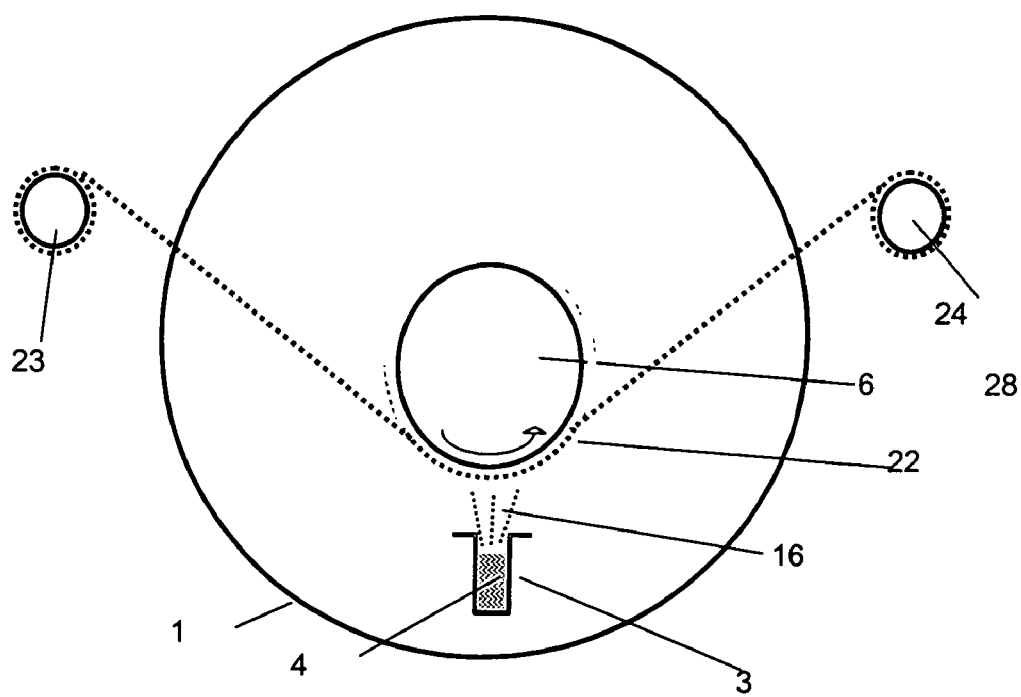

FIG. 10 shows a vacuum chamber (1), a web (22) that is supplied by an unwinding roller or supply roller(23), conveyed over a guiding roller (6) and wound up on a winding roller (24), moving continuously or discontinuously in a forward direction through a vapor stream (16), provided by the mixture of raw materials (4) present in the tray or boat (3) and heated to provide a vapor source generating said vapor stream (16), in order to provoke a phosphor layer to be deposited onto the support web (21) and wherein the unwinding roller (23) and the winding roller (24) are outside the vacuum chamber (1), in the surrounding ambient atmosphere. Not shown in the FIG. 10 (but optionally present as in FIG. 9, if the raw materials get exhausted) is a source of raw materials supplying the raw materials (26)(see FIG. 9), with the aid of a guiding mechanism (27) (see FIG. 9), to the site where said raw materials should be vaporized. Multiple sources may of course also be used.

Figure 11:
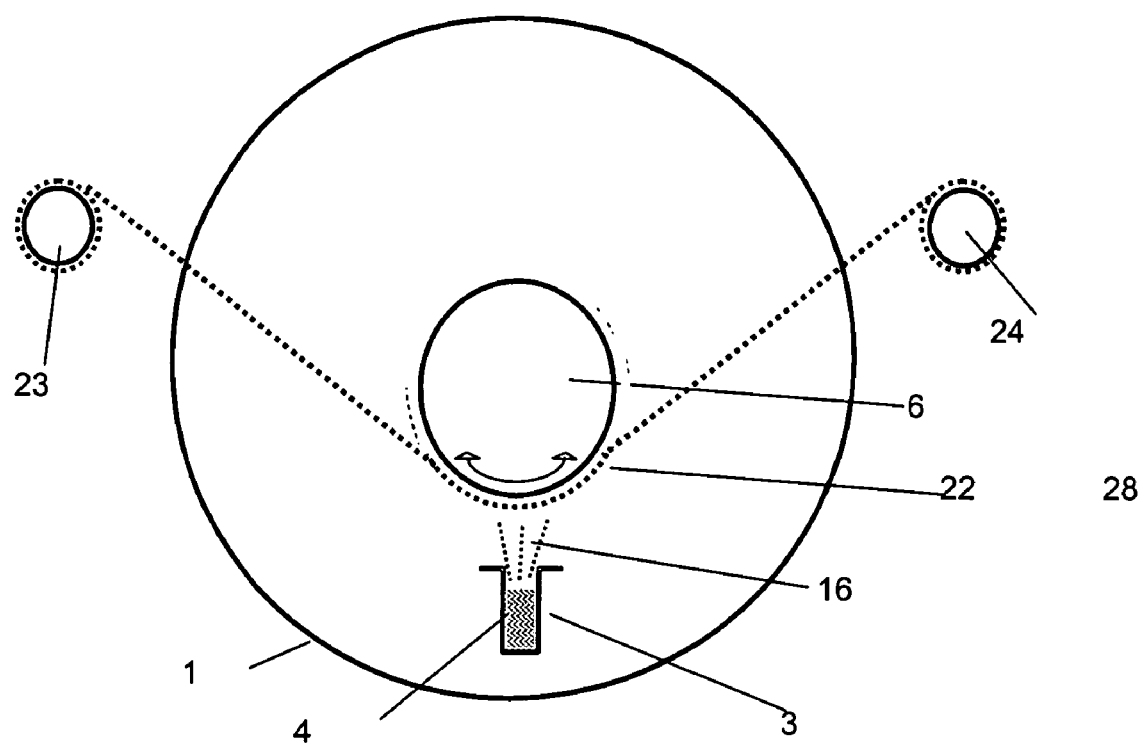

FIG. 11 shows a vacuum chamber (1), a web support (22) that is supplied by an unwinding roller (23), conveyed over a guiding roller (6) and wound up on a winding roller (23), moving continuously or discontinuously in a forward and backward direction through a vapor stream (16), provided by the mixture of raw materials (4) present in the tray or boat (3) and heated to provide a vapor source generating said vapor stream (16), in order to provoke a phosphor layer to be deposited onto the support web (22) in successive steps and wherein the unwinding roller (23) and the winding roller (24) are outside the vacuum chamber (1) in the ambient atmosphere (28). Not shown in the FIG. 11 (but optionally present as in FIG. 9, if the raw materials get exhausted) is a source of raw materials supplying the raw materials (26) (see FIG. 9), with the aid of a guiding mechanism (27) (see FIG. 9), to the site where said raw materials should be vaporized. Multiple sources may of course also be used.

DETAILED DESCRIPTION OF THE INVENTION

According to the present invention a method for coating is provided of a phosphor or a scintillator layer onto a flexible substrate, within a sealed zone maintained under vacuum conditions—also called "vacuum chamber"—, by the step of vapor deposition in a coating zone onto said flexible substrate, wherein said phosphor or scintillator layer is (continuously or discontinuously) deposited onto said flexible substrate, characterized in that said substrate is deformed at least before, during or after said step of vapor deposition. Configurations wherein said flexible substrate is mounted onto a roller or wherein it is guided over one or more roller(s) or wherein said substrate is, at least partially, guided over one or more guiding frame(s) when guided over more roller(s) are particularly envisaged.

Within the scope of the present invention the term "flexible substrate" should be understood as "reversably deformable supporting or supported layer in form of a sheet, web or roller", the surface area of which should be coated with a phosphor or scintillator material. Such a substrate should be present as a flexible sheet, also called "web" when present as flexible material, wound up in form of a roller. When large distances should be bridged in the coating apparatus and, optionally, outside thereof, in the coating process of the present invention, the web support should preferably be guided over a frame or over rollers in order to avoid undesired sagging. Differing configurations in order to guide the substrate are thus available in the sealed zone of the coating apparatus or, optionally, outside said sealed zone as illustrated in the Figures, without however being limited thereto.

According to the coating process or method according to the present invention, said substrate is, at least partially, moving over one or more roller(s) and/or guiding frame(s). This has been illustrated in the FIGS. 1-11.

It is an essential feature that the flexible substrate is deformed at least before, during or after said step of vapor deposition, by being mounted onto a roller or by being guided over one or more roller(s), in the vacuum chamber. Use of rigid plates or substrates, that cannot be deformed, does not provide an "on-line" vapor deposition step so that a larger surface is coated, but opposite thereto require a "batch process". When the term "deformed" is used in the following description, it is understood as "deformed by being mounted onto a roller or by being guided over one or more roller(s). Guiding means, such as a guiding roller or a guiding frame provide to bring the sheet or web in a condition, as desired in a flat, concave or convex screen, plate or panel in specific applications suitable for use in high energy radiation detection and imaging and, more particularly, in computed radiography, screen/film radiography and direct radiography as set forth.

Guiding means deforming the flexible substrate have been shown in the FIGS. 1-11, without however being limited thereto. It is essential to deform the substrate at least once before, during or after passing the vapor stream provided by the mixture of raw materials present in the crucible, tray or boat and heated to provide a vapor source generating said vapor stream to become deposited onto the flexible support or substrate.

An illustration of deforming the flexible substrate (at least) before (and not during) coating wherein the substrate is running or travelling as a "flat substrate" through the vapor stream has been schematically illustrated in the FIGS. 2, 3, 4 and 5. Deformation in that case is performed at the conveying roller positions of the web, wherein those conveying rollers are positioned within the vacuum chamber as in the FIGS. 2 and 3, or outside the vacuum chamber as in the FIGS. 4 and 5.

An illustration of deforming the flexible substrate (at least) after (and not during) coating, has been given in the same Figures, wherein it is further illustrated that the flexible substrate runs like a "flat" web (whether or not conveyed over a frame) over the vapor stream. Depending on the distance between the rollers and weight of the web, even when being stretched, the web may be slightly curved when passing the vapor stream. It remains essential to get a uniform coating over the whole width of the web and it is clear that uniformity over its length can only be performed when the web is travelling continuously or discontinuously at a constant rate, whether or not interrupted at constant intervals, e.g. at a constantly "pulsed" rate, such that the amount of deposited material is constant. The amount of deposited material results from a combination of moving speed of the support or substrate and amount of evaporated material per time unit.

An illustration of deforming the flexible substrate during coating (but also before, at the position of the "supplying" unwinding roller and after, at the position of the "collecting" (up)winding rollers), has been given in the FIGS. 8, 9, 10 and 11.

Figure 1:
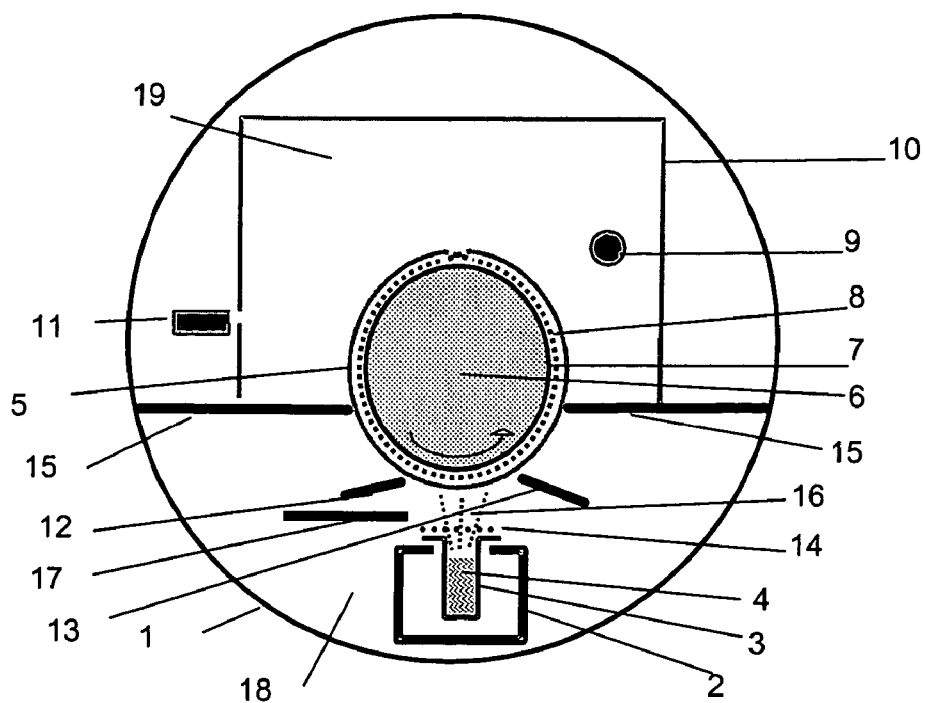
FIG. 1 shows a cylindrical vacuum chamber (1), containing an electrically heated oven (2) and a refractory crucible, tray or boat (3) containing a mixture of raw materials (4) which should be vaporized in order to be deposited onto a flexible sheet (5). The flexible sheet (5) is supported by a cooled—supporting—roller (6), thermally isolated from said flexible sheet (5) by a thermal isolation layer (7) and by heat-resisting coiled springs (8) mounted circumferentially onto said cylinder, further interconnecting both ends of said flexible sheet (5). Heating of said flexible sheet (5) proceeds by means of infrared heater (9) and reflector cage (10). Pyrometer (11) allows measurement of the temperature. The flexible sheet (5) is moving continuously or discontinuously in a forward direction through a vapor stream (16) provided by the heated mixture of raw materials (4) as a source for said vapor stream (16). Baffles (12) and (13) restrict vapor deposition to a selected part of sheet (5), mounted onto the roller (6). Refractory boat or tray (3) is covered with metallic raster (14), which avoids formation of pits (and unevenness) on the coated phosphor layer, deposited onto the flexible sheet (5). A cooled baffle (17) may be moved to shut off the surface to be coated from or expose the surface to be coated to the vapor stream.

In the FIGS. 1, 6 and 7 the flexible substrate is mounted onto a (cooled) support roller and deformed from being presented as a flat substrate at the vapor deposition area in the vapor stream. In those FIGS. 1, 6 and 7, the substrate is thus continuously deformed from being flat, and held in a constantly curved position, while being rotated over the (optionally cylindrical) support roller. It is clear that it is not an object to use the coated flexible support sheet in such a curved position, but to deform it after demounting or removing the coated sheet from the support roller. It is contemplated to deform the coated substrate in a way in order to get a flat, convex or concave scintillator or storage phosphor sheet or panel.

In a further preferred embodiment according to the present invention said phosphor or scintillator layer is (continuously or discontinuously, as explained before) deposited onto said flexible substrate, and said substrate is continuously supplied, either in a forward direction (FIGS. 1, 2, 4, 8 and 10) or in a forward and backward direction (FIGS. 3, 5, 7, 9 and 11). Accordingly the substrate to be coated is continuously supplied, as most preferred embodiment in practicing the present invention. This has been illustrated in all of the FIGS. 1-11 and indeed is essential in order to have an "on-line" vacuum deposition, providing the advantages of large, uniformly coated areas of scintillator or phosphor sheets, panels or webs to be cut into desired formats.

Moreover the present invention advantageously provides an accessible manufacturing method of phosphor or scintillator plates, sheets or panels, wherein the yield of the manufacturing process is unexpectedly high, as undesired losses of expensive raw materials and coated sheets or panels, are avoided. A constant coating quality furtheron avoids spill of material, due to deviations from required specifications as a constant layer thickness and a desired homogeneity and phosphor speed over large surface areas are both attained.

With respect to availability to deform the flexible substrate, it has unexpectedly been shown that, for a phosphor or scintillator layer with a thickness of up to 500 μm, and even up to 1000 μm, no problems are encountered with respect to occurrence of undesirable cracks when said flexible substrates have been deformed at least before, during or after said step of vapor deposition, by being mounted onto a roller or by being guided over one or more roller(s). The present invention describes a method to manufacture, in one and the same manufacturing process and on the same substrate, all desired formats of panels or screens for use in computed radiography, screen/film radiography and direct radiography.

The possibility to deform the flexible substrate creates the opportunity to coat large surface areas of such a flexible substrate with the vapor deposited scintillator or phosphor within a limited geometrical space.

In the coating process according to the present invention, said phosphor or scintillator layer (after having been coated onto said flexible substrate) is deposited onto an area of said flexible is substrate, exceeding the area of a phosphor or scintillator screen, panel or plate ready-for-use with at least 50%. More preferably in the coating process according to the present invention, said phosphor or scintillator layer is deposited onto an area of said flexible substrate, exceeding the area of a phosphor or scintillator screen, panel or plate ready-for-use with at least a factor of 5, and even more preferably with at least a factor of 10. The expression "screen, panel or plate ready-for-use (in a scanning apparatus)" refers to a well-known area of 14"×17" (35.6 cm×43.2 cm) as being commercially available.

According to the present invention said coating process is further comprising the step of cutting said substrate, carrying said deposited phosphor or scintillator layer.

Another aspect related with the coating process according to the present invention is that said flexible substrate is passing, at least once, through said coating zone by a continuous or discontinuous motion in a forward sense. Such a movement has been indicated by the arrows present in the FIGS. 3 and 5 for moving sheets, plates or panels and in the FIGS. 7, 9 and 11 for a moving web substrate. Whereas a "continuous" movement is indicating that there is no interruption and, more preferably a movement at a constant rate, "discontinuous" means that the movement is e.g. pulsed, more preferably at a constant pulse frequency. From the FIGS. 1, 6, 8 and 10 it is clear that a flexible substrate mounted on a support roller is passing more than once through the vapor stream until the desired phosphor or scintillator coating layer thickness is attained. Same is learnt from the FIGS. 2 and 4 where the flexible substrate is passing the vapor stream as a flat substrate.

In still another embodiment according to the coating process of the present invention said flexible substrate is moving (through said coating zone), in (continuous or discontinuous) successive steps of forward and backward motion, whether or not interrupted inbetween said successive steps. Such an interrupted movement can be applied to all of the FIGS. 1 to 11. So the movement may be controlled by pulses from any driving force, as e.g. from a motor. More in particular, looking at the Figures, it may even be advantageous for the configurations illustrated in the FIGS. 3, 5, 7, 9 and 11, where the movement should be interrupted as the moving direction changes in a "swinging" way. While travelling in a forward or backward direction, the movement may however proceed continuously or discontinuously (e.g. pulsed). Each change in direction however implies that there is at least a sudden moment (when changing) that the movement is temporarily stopped. This interruption may be restricted thereto or may be extended up to a well-defined time.

An advantageous aspect of a "swinging movement", with moving cycles from one to an opposite direction, is related with the frequent material deposition and formation of a plurality of layers onto the flexible substrate.

In still another embodiment according to the coating process of the present invention said substrate is moving (or running) over at least one unwinding or supplying roller and/or one roll up or winding roller, wherein none, one or both of said roller type(s) is(are) present outside said sealed zone. This has e.g. been illustrated in the FIGS. 8 and 9 (none outside, both inside the sealed zone of the coating apparatus) and in the FIGS. 10 and 11 (both rollers outside the coating apparatus) respectively, as explained hereinbefore. Such a configuration is only applicable if enough free space is available in the coating apparatus, and, more particularly in the sealed zone.

In the coating process according to the present invention, said substrate is a self-supporting sheet, plate, web or panel. In another embodiment according to the present invention, said substrate is a roller web. In still another embodiment of the coating process according to the present invention said substrate is supported by a substrate holder.

According to the coating process of the present invention said (flexibly moving) substrate is selected from the group consisting of glass, a ceramic material, a polymeric material or a metal. According to the coating process of the present invention the moving substrate support for the layer to be deposited is preferably selected from the group consisting of glass, polyethylene therephthalate, polyethylene naphthalate, polycarbonate, polyimide, aluminum, Pyrex®, polymethylacrylate, polymethylmethacrylate, sapphire, zinc selenide, Zerodur®, a ceramic layer and a metal or an alloy selected from the group of aluminum, steel, brass and copper. It should not be limited thereto as in principle, any metal or synthetic material resisting irreversible deformation, e.g. as by melting, after addition of energy to the extent as commonly applied in the coating process of the present invention, is suitable for use. Particularly preferred as flexibly moving substrate in the coating process of the present invention is aluminum as a very good heat conducting material allowing a perfect homogeneous temperature over the whole substrate.

In a coating process of the present invention said metal substrate is an aluminum layer, previously coated with a protective layer being an oxide or a polymeric compound layer, present on at least a side of said substrate moving through said vapor stream (thus on the side of said substrate whereupon vapor deposition is applied).

In a further preferred embodiment of the coating process of the present invention, said metal substrate is an anodized aluminum layer having a thickness of less than 600 μm, and even more preferably said thickness is in the range from 100 μm up to 450 μm. Most preferred is a moving substrate having been treated mechanically or electromechanically as e.g. an aluminum support having been anodized. Such a coating substrate, available as anodized aluminum, has shown particularly favorable adhesion characteristics with respect to physicochemical vapor deposited phosphors or scintillators coated in the process according to the present invention. In practical applications wherein a flexible supporting web is required, according to the method of the present invention anodized aluminum having a thickness of less than 600 µm, and more preferably at most 400 µm is desired, more particularly if the layer should be bent on rollers. Such a flexible anodized aluminum supporting web indeed allows very good adhesion of deposited scintillator layers after vapor deposition coating as applied in the coating method of the present invention: even bending of that flexible support coated with a scintillator layer having a thickness of 500 µm up to 1000 µm, does not cause "cracks" or delamination of scintillator or phosphor "flakes".

Temperature increase of the substrate due to presence of the flexible substrate in the vapor flow during a long time may however be disadvantageous and may require a configuration with a cooling circuit for the substrate, e.g. via a cooled plate or roller.

The coating process within a sealed zone maintained under vacuum conditions thus provides the possibility to deposit a phosphor or scintillator, known as a material emitting photons upon exposure to electromagnetic radiation, in form of a layer onto a surface of a flexible substrate, serving as a supporting or supported material, while moving said flexible substrate support as claimed. According to the coating process of the present invention the step of vapor deposition is initiated by a vapor flow of raw materials from one or more container(s), and wherein said vapor flow is generated by adding energy to said raw materials, by thermal, electric, or electromagnetic energy or by a combination thereof.

Depending on whether a chemical reaction takes place between components of the raw materials in the crucible(s) while those raw materials get liquefied by added energy, in the vapor stream or in the deposition step, the vapor deposition process is a chemical or a physical deposition process. In the coating process according to is the present invention said step of vapor deposition thus proceeds by physical vapor deposition, by chemical vapor deposition or a by combination of physical and chemical (physicochemical) vapor deposition.

In a common arrangement within the sealed zone under vacuum pressure (vacuum conditions corresponding with at least $10^{-1}$ mbar, and even down to $10^{-4}$ mbar or less if attainable in the preferred configuration of the coating apparatus), the container is one crucible, preferably in form of an elongated "boat". In another embodiment, it is composed of a plurality of crucibles, arranged in each direction of the two-dimensional, coated surface. It is evident that the composition of the raw material in the containers is chosen in order to provide a composition as desired, wherein said composition is determined by the ratios of raw materials present. Ratios of raw materials are chosen in order to provide the desired chemical phosphor or scintillator composition after deposition of the vaporized raw materials: particular embodiments in order to provide a more homogeneous incorporation of an activator element, as e.g. a europium dopant in preferred embodiments when applying the method of the present invention, has been described in EP-Applications Nos. 03104842 and 03104859, both filed Dec. 19, 2003 and in EP-Applications Nos. 041008675, 04100678 and 04100679, all of them having been filed Feb. 20, 2004 and which are all of them incorporated herein by reference. It is desirable to mix the raw materials in order to get a homogeneous raw mix in the crucible(s) in form of solid powders, grains or granules, or as pastilles having a composition corresponding with the desired ratios of raw materials in order to provide the desired phosphor coated onto the moving substrate material. A milling procedure may be favorable in order to provide a high degree of homogeneity before vaporization and is therefore recommended. Differing components may also be vaporized from different crucibles, arranged in series or in parallel or in a combined arrangement as already suggested before, provided that a homogeneous vapor cloud is presented to the flexible substrate via the vapor stream or flow, deposited by condensation onto said substrate. Two elongated one-part boats having same or different raw material content or raw material mixtures may e.g. be present in series in the moving direction of the web. In another embodiment, if providing a more homogeneous coating profile, boats may be arranged in parallel on one axis or more axes, perpendicular to the moving direction of the support, provided that overlapping evaporation clouds again are providing a vapor stream that becomes deposited onto the support in a phosphor or scintillator layer having a homogeneous thickness, composition and coated amount of said phosphor or scintillator. Presence of more than one crucible may be in favor of ability to supply greater, more voluminous amounts of phosphor or scintillator material to be deposited per time unit, the more when the flexible substrate should pass the vapor flow at a rate, high enough in order to avoid a too high temperature increase of the substrate. The velocity or rate at which the substrate passes the container(s) should indeed not be too slow in view of undesired local heating of the substrate support, making deposition impossible, unless sufficient cooling means are present in favor of condensation. The supporting or supported substrate should therefore preferably have a temperature between 50° C. and 300° C. in order to obtain deposited phosphor or scintillator layers having the desired optimized properties.

As already mentioned hereinbefore energy should be supplied to one or more container(s), also known as crucible(s), tray(s) or boat(s), in order to provoke a vapor flow (or stream) of the raw materials present therein, which become vaporized in the sealed vacuum zone: energy is submitted thereto by thermal, electric, or electromagnetic energy sources. As an example of an electromagnetic energy source a diode, a cathodic arc, a laser beam, an electron beam, an ion beam, magnetron radiation or radio frequencies may be used, whether or not pulsed, without however being limited thereto. Electric energy is commonly provided by resistive heating, making use of resistance coils wound around the container(s) or crucible(s) in a configuration in order to get conversion into thermal energy, thereby providing heat transfer to the containers or crucibles filled with the raw materials that should be evaporated. Energy supply to an extent in order to heat the container(s) or crucible(s) up to a temperature in the range from 550° C. to 900° C. is highly desired. At those temperatures, it is clear that containers should resist corrosion, so that refractory containers are preferred. Preferred container or crucible materials therefore are tungsten, tantalum, molybdenum and other suitable refractory metals. Energy supply as set forth heats the mixture of raw materials in the crucible to a temperature above 450° C., preferably above 550° C., and even more preferably in the range of 550° C. up to 900° C.

A cloud of vaporized material, originating from the target raw materials thus escapes as a cloud in form of a flow or stream from the container(s) or crucible(s) in the direction of the moving substrate, where a coated layer is formed by condensation. From the description above it is clear that, in order to obtain a homogeneous coating profile as envisaged, a homogeneous cloud can only be realized when homogeneity is provided in the bulk of the liquefied raw material. As a consequence, a homogeneous distribution of energy supplied over the container is a stringent demand. In a preferred embodiment, in favor of homogeneity, the crucible is in form of a single elongated "boat" with a largest dimension corresponding with the width of the flexible support moving over the said crucible so that at each point of its surface area the momentarily velocity magnitude is constant.

In any configuration providing the possibility for the substrate support to pass the raw material container(s) more than once, more than one phosphor or scintillator layer is optionally deposited, if desired. Addition to the crucible(s) of raw materials determining, and, optionally, changing the chemical composition of the scintillator to be deposited in the vapor deposition process, provides the possibility to gradually change the scintillator composition in thickness direction of the deposited scintillator layer.

Even when no change in composition in the thickness direction is desired, it is clear that the raw material containing crucible(s) become exhausted during the physical vapor deposition process, set forth hereinbefore. Therefore "replenishment" of the crucible(s) should be provided, e.g. by addition of raw material components in powdery form, in form of grains or crystals or in form of pastilles containing caked powder or grain mixtures, in favor of maintaining homogeneity during the further evaporation process as otherwise, differences in dopant (Europium) concentrations may appear while the coating process is running furtheron. Methods in order to "replenish" the crucible(s) have e.g. been described in U.S. Pat. No. 4,430,366, in DE-A 1 98 52362 and in US-A 2003/0024479 A1. An example of an available replenishing unit has been illustrated in the FIGS. 8 and 9, wherein, as a non-limitative example, also applicable in the other Figures, a source of material supply (26) and a guiding mechanism for raw material supply (27) have been mounted in the vacuum deposition chamber. If required during the deposition process oxygen can be introduced into the vacuum deposition chamber in form of oxygen gas or in form of oxides, to be added to the crucibles. Such a chemical vapor deposition step may be favorable with respect to e.g. the preparation of silicate phosphors. Also an annealing step inbetween two deposition steps or at the end of the phosphor deposition may be beneficial.

Another factor with respect to coating amount and thickness is the distance between container(s) and moving substrate. The distance determines the profile of the vapor cloud at the position of the flexible substrate. Average values of shortest distances between crucible(s) and substrate are preferably in the range of from 5 to 10 cm. Too large distances would lead to loss of material and decreased yield of the process, whereas too small distances would lead to too high a temperature of the substrate.

Care should further be taken with respect to avoiding "spot errors" or "pits", resulting in uneven deposit of phosphors or scintillators, due to spitting of the liquefied raw materials present in the heated container(s). One way to avoid spots to reach the moving web or support is to provide the container(s) with a metallic raster, supported by the surrounding edges of said container(s) and covering, at least in part, the container(s). Different configurations are available in order to get the most advantageous solution in order to avoid those spot defects.

In a preferred embodiment a guiding plate, guiding the vapor stream towards the substrate may be present in order to better or more sharply define the region wherein phosphor or scintillator material should become deposited. So a baffle as in FIG. 8 (but also advantageously mounted in the configurations represented in the other Figures) restricts the vapor deposition region on the moving substrate to a small segment or sector, in order to prevent undesired deposition of scintillator material as e.g. on the wall of the vacuum chamber. Particular measures taken in order to improve homogeneous heating of crucibles and evaporation of the raw materials present therein and in order to further avoid sputtering and generation of point defects on the phosphor plate have e.g. been disclosed in EP-Applications Nos. 03102003 and 03102004, both filed Jul. 4, 2003, the contents of which is incorporated herein by reference.

The more space is left free in the vacuum chamber, the more control sites are available. Free space can be provided e.g. with heat controlling means and sensors for temperature control at different sites, with regard to optimize homogeneous vapor deposition onto the moving flexible support. Otherwise, means in order to locally enhance the temperature, as e.g. by infrared radiation, can be provided in the vacuum chamber, where free space allows such installation (e.g. in the neighborhood of the cooling roll, or whatever a critical site within the vacuum chamber). Means in order to control layer thickness of deposited material can also be installed in order to stop the deposition process when the desired thickness is attained.

According to the coating process of the present invention, at the moment of deposition, said phosphor or scintillator layer is a binderless layer. This can be well understood, as at those high temperatures, presence of additional binders besides phosphors or scintillators raw materials in the container(s) would not be practical. It is however not excluded to make use of polymers, showing ability to become vaporized, in order to serve as binder material e.g. between substrate and phosphor or scintillator layer or even between the preferred phosphor or scintillator needles in the coated layer. Moreover when laminating a polymer layer onto the deposited layer, it is not excluded that polymer material is filling, at least in part, the voids between those needles. With respect to the specific application, related with CR and DR, it is clear that in view of image quality, and more particularly in view of sharpness, binderless phosphor or scintillator layers are preferred. With respect thereto it is clear that vaporization of raw materials in order to build the desired scintillators phosphors is a preferred technique, provided that, according to the present invention the layers have been deposited on a flexible substrate, deformed at least before, during or after said step of vapor deposition, by being mounted onto a roller or by being guided over one or more roller(s), as claimed, and wherein it is envisaged to deform the flexible support in order to get a flat sheet or panel, ready-for-use, suited for specific CR and DR applications as set forth.

In one embodiment according to the coating process of the present invention said phosphor is a prompt emitting luminescent phosphor. Said luminescent phosphor is suitable for use e.g. in intensifying screens as used in screen/film radiography.

According to the coating process of the present invention, in another embodiment said phosphor is a photostimulable phosphor and, even more preferred according to the coating process of the present invention, said photostimulatable (storage) phosphor is a CsBr:Eu phosphor. Related therewith and particularly preferred in the coating process according to the present invention, although not limited thereto at all, said raw materials are CsBr and between $10^{-3}$ and 5 mol % of a Europium compound selected from the group consisting of $EuX'_2$, $EuX'_3$ and $EuOX'$, $X'$ being a halide selected from the group consisting of F, Cl, Br and I as has been used in the preparation method disclosed in PCT-filing WO 01/03156, which is incorporated herein by reference. Even more preferred is the binderless coating process according to the present invention of the selected CsBr:Eu phosphor from CsBr and EuOBr raw materials, wherein the said phosphor is characterized by its particular needle-shaped form. The high degree of crystallinity is easily analyzed by X-ray diffraction techniques, providing a particular XRD-spectrum as has been illustrated in EP-A 1 113 458, which is also incorporated herein by reference. Therefore a mixture of CsBr and EuOBr is provided as a raw material mixture in the crucibles, wherein a ratio between both raw materials normally is about 90% by weight of the cheap CsBr and 10% of the expensive EuOBr, both expressed as wt %. It has however been shown that as a function of coating (evaporating) temperature ratios can be adapted in favor of lower material and production cost, without resulting in changes in composition: so higher vaporization temperatures for the raw material mixture in ratio amounts of 99.5 wt % CsBr and 0.5 wt % EuOBr provide the same result as before. As already set forth hereinbefore, particular embodiments in order to provide a more homogeneous incorporation of an activator element, and more particularly of a europium dopant in preferred embodiments when applying the method of the present invention, have been described in EP-Application Nos. 03104842 and 03104859, both filed Dec. 19, 2003 and in EP-Application Nos. 041008675, 04100678 and 04100679, all of them having been filed Feb. 20, 2004, which are all of them incorporated herein by reference.

The preferred CsBr:$Eu^{2+}$ phosphor, obtained after vapor deposition as a needle-shaped phosphor, is characterized by voids between the needles. In order to fill those voids, measures can be taken as described in EP-A 1 347 460, wherein voids are partially filled with a polymeric compound; as in EP-A 1 349 177, wherein vapor deposited pigments like the preferred β-Cu-phthalocyanine nanocrystalline dye compound are filling said voids or as in EP-Application No. 03 100 471, filed Feb. 26, 2003, wherein the voids are at least partially filled with polymeric compounds selected from the group consisting of silazane and siloxazane type polymeric compounds, mixtures thereof and mixtures of said silazane or siloxazane type polymeric compounds with compatible polymeric compounds, which is incorporated herein by reference. More particularly with respect to the said dyes or pigments, vapor deposition thereof can be performed in the vacuum deposition chamber used in the configuration of the production method according to the present invention.

In a further embodiment according to the coating method or process of the present invention, said process is characterized by the step of applying a protective coating onto said phosphor or scintillator layer. Preferably, said protective coating is coated or laminated onto said phosphor or scintillator layer inside said sealed zone, maintained under vacuum conditions. Most preferably said protective coating is organic resin layer. More in particular, said protective layer is provided in order to protect the coated scintillator or phosphor against dust and moisture. Such a protective coating composition is not restricted to one layer, but may comprise more than one layer as has e.g. been described in EP-A 1 286 363, wherein said protective layer is divided in at least two layers, being a layer A, closest to said phosphor layer and a layer B, farther away from said phosphor layer; characterized in that said layer A has a lower water vapor permeability coefficient than said layer B. Just as in EP-A 1 286 364, said layer A preferably is a layer of parylene, and more preferably said parylene is selected from the group consisting of parylene C, parylene D and parylene HT. It is not excluded to have such a parylene layer coated onto said flexible substrate as in EP-A 1 376 615, wherein a moisture repellent layer is present inbetween the substrate and the phosphor layer. It is moreover not excluded to have a film-forming silazane or siloxazane type polymeric compound, covering the outermost surface of the poly-paraxylylene film on the phosphor side as has been disclosed in EP-Application No. 03 100 472, filed Feb. 26, 2003, which is incorporated herein by reference.

In a particular embodiment said vapor deposited protective composition is thus applied in the same sealed zone in the same coating apparatus. Such a protective composition and/or laminate is advantageously applied to the preferred CsBr:$Eu^{2+}$ storage phosphor, which is known to be moisture sensitive. Other hygroscopic phosphors that are advantageously prepared according to the method of the present invention are e.g. BaFCl:Eu, BaFBr:Eu and GdOBr:Tm, used in intensifying screens; CsI:Na applied in scintillator panels and storage phosphors suitable for use in computed radiography (CR) as e.g. BaFBr:Eu, BaFI:Eu, (Ba,Sr)F(Br,I):Eu, RbBr:Tl, CsBr:Eu, CsCl:Eu and RbBr:Eu; or CsI:Tl, which is particularly suitable for use in DR-cassettes.

In the coating process according to the present invention the step of applying a protective coating or laminate onto said phosphor or scintillator layer is advantageously performed, wherein said protective coating is an organic resin layer.

In another embodiment in the coating process according to the present invention the step of applying a protective coating or laminate onto said phosphor or scintillator layer is advantageously performed, wherein said protective coating is an inorganic layer.

Protection by an overcoat layer of "parylene" is particularly recommended. Details about the composition of this layer can be found in EP-A's 1 286 362, 1 286 363, 1 286 364 and 1 286 365, which are all of them incorporated herein by reference: in the method of applying a protecting parylene layer to the phosphor coatings therein as a "parylene layer" a halogen-containing layer is preferred. More preferably said "parylene layer" is selected from the group consisting of a parylene D, a parylene C and a parylene HT layer. In the particular case as in the method of the present invention a cross-linked polymeric layer is thus formed on a phosphor screen material, wherein the said polymeric material layer has been formed by reaction of at least one component, thereby forming self-condensing polymers. Reactive monomers are provided in form of heated vapor in order to form the desired condensation polymer on the substrate, wherein said condensation polymer is in form of a p-xylylene or "parylene" layer on the phosphor screen substrate. Examples of these "parylene" layers are poly-p-xylylene (Parylene-N), poly-monochloro-p-xylylene (Parylene-C) and polydichloro-p-xylylene (Parylene-D). If desired a pigment can be integrated into a thin film of a poly-p-xylylene as has been described in JP-A 62-135520.

Within the scope of the present invention a choice may be made, whether to deposit the parylene layer "in situ" or to laminate it as a foil onto the vaporized phosphor layer as illustrated before. It is recognized that besides "parylene", other useful polymers may also be used, either as a separate layer besides the said parylene layer, or as a second protecting layer as has e.g. been described in EP-A 1 286 363, which is incorporated herein by reference. Both layers may have a different water vapor permeability coefficient. In a preferred embodiment thereof the phosphor layer closest to the phosphor layer has a lower water permeability coefficient. It is not excluded to cover the aluminum layer before coating a layer of phosphor or scintillator material with a protective layer being a "parylene" layer as a polymeric compound layer, on a side of said aluminum layer whereupon vapor deposition of phosphor or scintillator material is applied afterwards. Moreover it is perfectly possible to apply the "parylene" layer in the same coating apparatus as mentioned before.

With respect to all configurations illustrated and explained hereinbefore, additional rollers may be provided in order to laminate the phosphor or scintillator layer with a protective layer as set forth hereinbefore, optionally in the same vacuum environment as wherein the phosphor deposition takes place. The coated scintillator or phosphor substrate and a laminating sheet or web, may be brought together, thereby laminating the phosphor or scintillator layer. In this process e.g. a transparent pressure sensitive adhesive layer, optionally released instantaneously from a temporary support layer, may be applied.

After having coated such a protective layer (or even in the absence thereof) a laminating (polymer) layer is advantageously applied, more particular with respect to protection of the phosphor or scintillator layer against abrasion in working conditions as e.g. in a scanner apparatus.

So in addition to a "parylene film" as a protective layer, a laminate polymer layer (e.g. PET—polyethylene therephthalate—or PEN—polyethylene naphthalate) is advantageously provided thereupon as an additional protective organic resin, whether used as a temporarily or permanent rigid (laminate) layer.

In order to end up with a rigid screen, plate or panel ready-for-use in scanners, the flexible plates are advantageously laminated against a rigid carrier. The rigid carrier can be either flat or non-flat, e.g. concave or convex at the side to which the flexible plate is laminated onto.

Accordingly the coating process of the present invention is further characterized by the step of laminating said substrate carrying the phosphor or scintillator layer onto a carrier layer.

More in particular according to the present invention said carrier layer is a flexible or rigid polymer layer.

In another embodiment according to the present invention, said carrier layer is a metal sheet, and even more preferably said carrier layer is a rigid metal sheet.

According to the coating process of the present invention, said step of laminating said substrate carrying the phosphor or scintillator layer is performed inside said sealed zone, maintained under vacuum conditions.

It is more suitable that cutting of the coated substrate into tailor made screen sheets, plates or panels in desired formats takes place out of the vacuum chamber. In a particular embodiment cutting may proceed on-line, e.g. when a sheet or web is leaving the sealed zone as the coated, and, optionally, laminate coated phosphor or scintillator, it can immediately be cut into screens, plates or panels having the desired format.

According to the coating process of the present invention the process further comprises the step of cutting after deposition of said phosphor or scintillator layer, or after applying said protective organic resin layer or layers onto said phosphor or scintillator layer.

The object to coat a surface as large as possible in a way to get a homogeneous deposit of phosphor or scintillator material over quite a large screen, sheet, plate or panel surface area becomes available by application of the method of the present invention. Said method moreover allows quite a lot of configurations in the vapor deposition coating apparatus as set forth.

In a practical application phosphor or scintillator screens or panels having a coated length in the range from e.g. 1.00 m up to at least 500 m and a coated width in the range from 0.50 m up to 3 m become available, depending on the dimensions of the sealed zone in the coating apparatus. So if mounted onto the cylindrical roller (as in FIG. 1) the substrate e.g. provides the possibility to perform the vapor deposition coating process over a width of about at least 90 cm and a length of at least 120 cm, depending on the corresponding circumference of the cylinder. In that case multiple rotations of the cylinder in order to get vapor deposition of a sufficiently thick layer may be required. A very important advantage of the present invention is thus attained by the availability of large, homogeneously coated layers onto the flexible substrates as set forth by the coating method of the present invention.

In order to summarize the advantageous effects of the present invention, it becomes clear from the description above that the problem of homogeneity, related with coating profiles of coatings in two dimensions as normally applied, is overcome by the method of the present invention: coatings in one preferred dimension, more particularly over the whole width of the supporting web, by application of the "on-line vapor deposition" method as set forth have been shown to be advantageously applicable in practice. Opposite thereto a support having limited bending capacity as e.g. a glass support having a thickness of some millimeters, can only be coated up to formats not exceeding the dimensions of the vacuum chamber, unless the glass support would leave the sealed zone of the coating apparatus. Although providing the possibility to get more than one layer deposited, e.g. when such a deposition proceeds in a "swinging" way, lack of deformability limits the format of the coating of a phosphor or scintilator layer on a substrate to the largest cross section of the vacuum deposition chamber.

The said vapor deposition process according to the present invention thus proceeds in a sealed zone under vacuum conditions and as it is directed in a more dedicated way, i.e. in an "on-line linear deposition process", instead of onto a two-dimensional circular or rectangular support. As a result, practically the whole coated supporting web can effectively be made available in flat panel detectors for CR and DR applications without loss of expensive residue or of residue that has to be recycled. The yield or efficiency of the deposition process is thus remarkably enhanced. First experiments unambiguously indicated that a yield increase was attained with a factor of about 5, as in the comparative batch depositing process in a rotational deposition configuration on rectangular substrates the yield was limited to about 15%, whereas application of the method of the present invention provided yields up to 75%! Besides saving expensive raw materials in view of cost price of those raw materials and of recycling costs thereof, the "time saving" factor offered by the continuous manufacturing method of the present invention is significant.

Due to the particular configuration of the sealed zone, maintained under vacuum conditions, quite a lot of space is free therein so that any measuring apparatus (as e.g. one or more thermal sensors) at different (critical) sites may provide increased control and direct adjustment of coating conditions in the vapor deposition stream for the method as applied according to the present invention. Enhanced measurement control and adjustment of critical process parameters directly contributes to an improved process control, an enhanced reproducibility and an optimized homogeneity, in favor of constant speed and image definition over the whole plate surface, even when large plates are envisaged.

Coatings of larger surfaces, as provided by the method of the present invention are further enabling the manufacturer to make a choice with respect to the dimensions of the plates: any size can be cut and delivered as "tailor made" ordered by the customer in order to be perfectly adapted to scanners used in image formation applications.

Coating on a large substrate, optionally cutted, and subsequent lamination onto a rigid plate of the flexible substrate on which the phosphor or scintillator layer has been deposited, is made possible by the unexpected flexibility of the phosphor layer and the perfect adhesion of the phosphor layer to the substrate. High flexibility and perfect adhesion is observed, even for phosphor layers having thicknesses up to at least 1 mm.

It is understood that the screens, panels, plates or sheets prepared by the method as set forth hereinbefore, are particularly suitable for use as phosphor or scintillator plates, in intensifying screens, in stimulable or storage phosphor screens, suitable for use in high energy radiation detection and image formation and, more particularly, in screen/film radiography, in computed radiography and in direct radiography. In those applications it is clear that the screens, plates or panels are mounted in a cassette, where appropriate.

As a result coated phosphor or scintillator layers for use in screens, plates or panels become available in unexpectedly large surface area formats. Moreover the said layers prepared according to the process or method of the present invention have an almost constant coating profile after having been prepared with an unexpected high yield and remarkably reduced loss of expensive raw materials.

While the present invention will hereinafter be described in connection with preferred embodiments thereof, it will be understood that it is not intended to limit the invention to those embodiments.

EXAMPLES

Comparative Example 1

This example describes the state-of-the art method performed in order to obtain a photostimulable CsBr:Eu imaging plate.

A CsBr:Eu photostimulable phosphor layer was deposited in a vacuum chamber via thermal vapor deposition on a flat rigid aluminum support that rotates around an axis perpendicular to and going through the centre of the support starting from a mixture of CsBr and EuOBr as raw materials. While rotating said support its momentary velocity magnitude is highest at the outside (at the boundary) of the support and zero in the centre of the support.

The support was heated with the aid of a resistively heated heating plate having a temperature of 240° C.

The support was aluminum having a thickness of 800 µm, a width of 18 cm and a length of 24 cm. The aluminum support was mounted, against a substrate holder, rotating in a controlled way by means of a motor, around its axis. The aluminum was rotating with an angular speed of 12 rotations per minute. The support was heated by means of a resistively heated heating plate at 240° C.

A mixture of CsBr and EuOBr, in a CsBr/EuOBr 99.5%/0.5% ratio by weight percentage was used as a raw material mixture to become vaporized and was placed in two containers. The distance between the containers and the substrate was about 15 cm. The containers were placed at the circumference of a circle described by an edge of the rotating substrate. The containers were covered with a cover plate having one slit therein and a guiding plate, guiding the vapor stream towards the substrate.

Under vacuum pressure (a pressure of $2 \times 10^{-1}$ Pa was maintained s as an equilibrium between a continuous inlet of argon gas into the vacuum chamber and continuous pumping) and at a sufficiently high temperature of the vapor source (750° C.) the obtained vapor was directed towards the rotating substrate and was deposited thereon.

A CsBr:Eu stimulable phosphor layer having an average thickness of 500 µm was deposited over the entire area of the support.

Only 13% by weight of the evaporated material was deposited onto the support.

An area of 0.043 $m^2$, suitable for practical use, was obtained.

The stimulable phosphor layer shows a blue luminescence under UV radiation.

Inventive Example 2

A CsBr:Eu photostimulable phosphor screen on flexible anodized aluminum was prepared in a vacuum chamber via thermal vapor deposition on a flexible anodized aluminum support, moving in such a way that the momentary magnitude of the velocity was constant over its whole area, starting from a mixture of CsBr and EuOBr as raw materials.

Referring to FIG. 1 the cylindrical vacuum chamber (1) with a diameter of 1.4 m and a length of 1.75 m was containing an electrically heated oven (2) and a refractory tray or boat (3) (dimensions of the elongated boat composed of "stainless steel 1.4828": 0.97 m (length)×4.5 cm (width)×6.8 cm (depth), having a wall thickness of 3 mm), in which 4 kg of a mixture (4) of CsBr and EuOBr in a 99.5%/0.5% CsBr/EuOBr percentage ratio by weight were present as raw materials to become vaporized. The boat was covered with a metallic raster (14) having a mesh of 300 µm in order to reduce the formation of pits during evaporation.

Under vacuum pressure (a pressure of $2 \times 10^{-1}$ Pa) maintained by a continuous inlet of argon gas into the vacuum chamber, and at a sufficiently high temperature of the vapor source (760° C.) the obtained vapor was directed towards a moving sheet support (5) and was deposited thereon successively while said support was moving along the vapor stream (16).

The anodized aluminum support (5) having a thickness of 380 µm, a width of 1.18 m and a length of 1.26 m, was mounted, with the anodized side at the side whereupon the phosphor should be deposited, around a cooled cylindrical support roller (6) having a diameter of 40 cm and a length of 1.18 m rotating in a controlled way by means of a motor around its axis. The anodized aluminum was moving with a constant linear velocity of 2 m per minute.

The cooled cylindrical support roller (6) was thermally isolated from the support sheet (5) by means of a thermal isolation layer (7) and by means of a heat-resistant coiled springs (8), mounted circumferentially around the cylinder.

The coiled springs (8) also interconnect both ends of the anodized aluminum plate in order to stretch the anodized aluminum around the support roller (6) and in order to overcome a loss of tension during heating up of the anodized aluminum, due to thermal expansion. The support (5) was actually resting on these coiled springs.

The support (5) was heated up to 150° C. by means of an infrared heater (9) and a reflector cage (10). The temperature was measured with a pyrometer (11).

A pair of baffles (12) and (13) limits the vapor deposition area on the support (5) to a small region or sector of 28 cm of the support roller. In that way undesired deposition of phosphor (as e.g. on the wall of the chamber) was prevented.

Another pair of separation plates (15) was dividing the vacuum chamber (1) in an evaporation chamber part (18) and a heating chamber part (19).

A CsBr:Eu stimulable phosphor layer having a mean thickness of 725 µm was deposited over the entire length of the support in successive steps, during which the thickness of the deposited layer was increasing, within a time of 79 minutes. The support was successively passing the vapor stream over the refractory boat or tray 125 times. The layer was thereby growing with an increasing thickness of 5.8 µm per rotation. During each rotation the layer was only growing effectively during a time of 0.14 minutes (=0.28 m per 2 m per minute). This corresponds with a time of 8.4 seconds while the support was passing the deposition window of 0.28 m. During the condensation process, the effective deposition speed, expressed as layer thickness per time unit, was 41 µm per minute or 0.7 µm per second.

A thickness homogeneity between 675 µm and 775 µm was obtained over a distance of 73 cm in a direction perpendicular to the moving direction and over a length of 1.20 m in the moving direction.

75% by weight of the evaporated material was deposited onto the support.

The stimulable phosphor layer was showing a blue luminescence under UV radiation.

The area of the above described imaging plate, effectively suitable for practical use was 0.87 m$^2$ (about 20 times the 0.043 m$^2$ available from the comparative example hereinbefore).

Panels having the desired size, e.g. 35 cm×45 cm, were cut out of the above described plate with a good edge quality. The cutted panels were then laminated against a rigid flat glass plate without damage of the layer, making use therefore of a transferable adhesive.

In the same way as described hereinbefore sizes of the vacuum deposited plates were increased up to an area of more than 2 m$^2$ by increasing the length of the anodized aluminum support to more than 2.74 m. This was performed by increasing the diameter of the support roller (6) from 0.4 m to 0.9 m.

In another experiment increase of the length of the anodized aluminum web was realized by adding supporting rollers in the evaporating part (18), in the heating part (19) and in both parts of the vacuum chamber (1). Stretching the anodized aluminum around those different support rollers made available a coating space in the most convenient and space-saving way (see FIG. 2 and FIG. 3).

If in the above mentioned vacuum chamber (1) a configuration with a rotating substrate should have been used, typically applied for the preparation of photostimulable imaging plates as described in comparative example 1, it could have been possible to obtain a maximum area, suitable for practical use of 1.54 m$^2$ only.

Inventive example 2 clearly shows that by use of a moving flexible substrate, moving in such a way that the said flexible substrate is moving at a momentary velocity magnitude remaining constant over the whole available area, wherein said substrate is deformed before, during and after said step of vapor deposition, photostimulable phosphor plates with a very good thickness homogeneity can be obtained that have an improved area suitable for use and an improved material yield if compared with the use of a substrate, rotating around an axis, perpendicular to and going through the center of the substrate, as in comparative example 1.

Inventive Example 3

A CsBr:Eu photostimulable phosphor screen was prepared in a vacuum chamber by thermal vapor deposition on a flexible anodized aluminum, that was supplied in a continuous fashion.

Referring to FIG. 8 a cylindrical vacuum chamber (1) with a diameter of 1.4 m and a length of 1.75 m was containing an electrically heated oven (2) and a molybdene tray or boat (3) (dimensions of the elongated boat: 0.97 m (length)×1.40 cm (width)×5.8 cm (depth), having a wall thickness of 3 mm), in which 1.6 kg of a mixture (4) of CsBr and EuOBr in a 99.5%/0.5% CsBr/EuOBr percentage ratio by weight were present as raw materials in order to become vaporized. The vacuum chamber (1) further contained a roller supply (23) of anodized aluminum that was fed out in continuous sheet form (22), also called "web". The web was conveyed over a cooled guiding roller (6) with a diameter of 40 cm and collected on a winding roll (24), collecting the web after vapor deposition coating.

The anodized aluminum support (22) having a thickness of 280 µm, a width of 0.65 m and a length of 10 m, was mounted in such a way that the anodized side was at the side whereupon the phosphor should be deposited. The web of anodized aluminum was moving with a velocity of 20 cm per minute.

Under vacuum pressure (a pressure of $2\times10^{-1}$ Pa) maintained by a continuous inlet of argon gas into the vacuum chamber, and at a sufficiently high temperature of the vapor source (760° C.) the obtained vapor was directed towards the moving anodized aluminum (21) and was deposited thereon while said anodized aluminum was moving continuously through the vapor stream.

A pair of baffles (12) and (13) limits the vapor deposition area on the support (22) to a small region or sector of 28 cm of the support roller (6). In that way undesired deposition of phosphor (as e.g. on the wall of the chamber) was prevented.

Another pair of separation plates (15) was dividing the vacuum chamber (1) in an evaporation part (18) and a winding part (25).

A cooled baffle (17) was moved in order to shut off the surface to be coated from, or to expose the surface to be coated to the vapor stream.

A CsBr:Eu stimulable phosphor layer having a mean or average thickness of 65 µm was deposited in a continuous way over a length of 3 m and a width of 0.65 m. The layer of 65 µm was thereby grown in 1.4 minutes, corresponding with the time that the surface to be coated was exposed to the vapor stream while passing the vapor stream (16). The effective deposition speed, expressed as layer thickness per time unit, was 46 µm per minute.

The deposited layer was wound up on the wind up roller (24) without the formation of cracks in the deposited phosphor layer.

The stimulable phosphor layer was showing a blue luminescence under UV radiation.

The area of the above described deposited phosphor layer, effectively suitable for practical use was ca. 2 m$^2$.

Panels having the desired size of 35 cm×43 cm were cut out of the above described deposited layer with a good edge cutting quality. The cutted panels were laminated, making use of a transferable adhesive, against a rigid flat glass plate without damage of the layer.

Inventive example 3 clearly shows that by use of a moving flexible substrate, supplied in roller form, huge areas deposited with a phosphor layer, are available. Out of these layers the right formats as desired can be cut and laminated against a rigid substrate.

Having described in detail preferred embodiments of the current invention, it will now be apparent to those skilled in the art that numerous modifications can be made therein without departing from the scope of the invention as defined in the appending claims.

Parts List (1) vacuum chamber
(2) oven
(3) crucible, tray or boat
(4) mixture of raw materials
(5) sheet (6) roller
(7) thermal isolation layer
(8) cylindrical springs
(9) infrared heater
(10) reflector cage
(11) pyrometer
(12) baffle
(13) baffle
(14) metallic raster
(15) separation plates
(16) vapor stream
(17) baffle
(18) evaporation part
(19) heating part
(20) conveying rollers
(21) travelling pathway
(22) web
(23) unwinding roller (supplying roller)
(24) (up)winding roller (collecting roller)
(25) winding part
(26) source of raw material supply
(27) guiding mechanism (for raw material supply)
(28) ambient atmosphere

The invention claimed is:

1. A method for coating a phosphor or a scintillator layer onto a flexible substrate, within a sealed zone maintained under vacuum conditions, by the step of vapor deposition, wherein said phosphor or scintillator layer is deposited onto said substrate in successive steps, characterized in that said substrate is deformed at least before, during or after said step of vapor deposition; further characterized by a step of applying a protective coating onto said phosphor or scintillator layer; further characterized by a step of laminating said substrate carrying the phosphor or scintillator layer onto a carrier layer wherein said carrier layer is selected from a metal sheet and a rigid polymer layer.

2. Coating process according to claim 1, wherein said phosphor or scintillator layer is deposited onto said flexible substrate, and wherein said substrate is continuously supplied.

3. Coating process according to claim 2, wherein said phosphor or scintillator layer is deposited onto an area of said flexible substrate, exceeding the area of a phosphor or scintillator screen, panel or plate ready-for-use by at least 50%.

4. Coating process according to claim 3, wherein said substrate is, at least partially, moving over one or more roller(s) and/or guiding frame(s).

5. Coating process according to claim 4, wherein said substrate is moving over at least one unwinding or supplying roller and/or one roll up or winding roller, wherein none, one or both of said roller(s) is(are) present outside said sealed zone.

6. Coating process according to claim 5, wherein said flexible substrate is passing, at least once, through said coating zone by a continuous or discontinuous motion in a forward sense.

7. Coating process according to claim 5, wherein said flexible substrate is moving in successive steps of forward and backward motion, whether or not interrupted inbetween said successive steps.

8. Coating process according to claim 4, wherein said flexible substrate is passing, at least once, through said coating zone by a continuous or discontinuous motion in a forward sense.

9. Coating process according to claim 4, wherein said flexible substrate is moving in successive steps of forward and backward motion, whether or not interrupted inbetween said successive steps.

10. Coating process according to claim 3, further comprising the step of cutting said substrate carrying said deposited phosphor or scintillator layer.

11. Coating process according to claim 3, wherein said substrate is moving over at least one unwinding or supplying roller and/or one roll up or winding roller, wherein none, one or both of said roller(s) is(are) present outside said sealed zone.

12. Coating process according to claim 11, wherein said flexible substrate is passing, at least once, through said coating zone by a continuous or discontinuous motion in a forward sense.

13. Coating process according to claim 11, wherein said flexible substrate is moving in successive steps of forward and backward motion, whether or not interrupted inbetween said successive steps.

14. Coating process according to claim 3, wherein said flexible substrate is passing, at least once, through said coating zone by a continuous or discontinuous motion in a forward sense.

15. Coating process according to claim 3, wherein said flexible substrate is moving in successive steps of forward and backward motion, whether or not interrupted inbetween said successive steps.

16. Coating process according to claim 3, wherein said substrate is a self-supporting sheet, plate, web or panel.

17. Coating process according to claim 16, wherein said metal substrate is an aluminum layer, previously coated with a protective layer being an oxide or a polymeric compound layer, present on at least a side of said substrate moving through said vapor stream.

18. Coating process according to claim 17, wherein said metal substrate is an anodized aluminum layer having a thickness of less than 600 μm.

19. Coating process according to claim 3, wherein said substrate is a roller web.

20. Coating process according to claim 19, wherein said metal substrate is an aluminum layer, previously coated with a protective layer being an oxide or a polymeric compound layer, present on at least a side of said substrate moving through said vapor stream.

21. Coating process according to claim 20, wherein said metal substrate is an anodized aluminum layer having a thickness of less than 600 μm.

22. Coating process according to claim 3, wherein said substrate is supported by a substrate holder.

23. Coating process according to claim 22, wherein said metal substrate is an aluminum layer, previously coated with a protective layer being an oxide or a polymeric compound layer, present on at least a side of said substrate moving through said vapor stream.

24. Coating process according to claim 23, wherein said metal substrate is an anodized aluminum layer having a thickness of less than 600 μm.

25. Coating process according to claim 3, wherein said metal substrate is an aluminum layer, previously coated with a protective layer being an oxide or a polymeric compound layer, present on at least a side of said substrate moving through said vapor stream.

26. Coating process according to claim 25, wherein said metal substrate is an anodized aluminum layer having a thickness of less than 600 μm.

27. Coating process according to claim 3, wherein said step of vapor deposition is initiated by a vapor flow of raw materials from one or more container(s), and wherein said vapor flow is generated by adding energy to said raw materials and said container(s), by thermal, electric, or electromagnetic energy or a combination thereof.

28. Coating process according to claim 3, wherein said step of vapor deposition proceeds by physical vapor deposition, by chemical vapor deposition or a by combination of physical and chemical vapor deposition.

29. Coating process according to claim 3, wherein said phosphor or scintillator layer is a binderless layer.

30. Coating process according to claim 3, wherein said phosphor is a photostimulable phosphor.

31. Coating process according to claim 30, wherein said photostimulable phosphor is a CsBr:Eu phosphor.

32. Coating process according to claim 3, wherein said phosphor is a prompt emitting luminescent phosphor.

33. Coating process according to claim 3, wherein said protective layer is coated or laminated onto said phosphor or scintillator layer inside said sealed zone, maintained under vacuum conditions.

34. Coating process according to claim 33, wherein said protective coating or laminate is an organic resin layer.

35. Coating process according to claim 33, wherein said protective coating or laminate is an inorganic layer.

36. Coating process according to claim 3, wherein said protective coating or laminate is an organic resin layer.

37. Coating process according to claim 3, wherein said protective coating or laminate is an inorganic layer.

38. Coating process according to claim 3, wherein said step of laminating said substrate carrying the phosphor or scintillator layer is performed inside said sealed zone, maintained under vacuum conditions.

39. Coating process according to claim 38, wherein said carrier layer is a rigid metal sheet.

40. Coating process according to claim 3, wherein said carrier layer is a rigid metal sheet.

41. Coating process according to claim 2, wherein said phosphor or scintillator layer is deposited onto an area of said flexible substrate, exceeding the area of a phosphor or scintillator screen, panel or plate ready-for-use by at least a factor of 5.

42. Coating process according to claim 41, wherein said substrate is, at least partially, moving over one or more roller(s) and/or guiding frame(s).

43. Coating process according to claim 2, wherein said phosphor or scintillator layer is deposited onto an area of said flexible substrate, exceeding the area of a phosphor or scintillator screen, panel or plate ready-for-use by at least a factor of 10.

44. Coating process according to claim 43, wherein said substrate is, at least partially, moving over one or more roller(s) and/or guiding frame(s).

45. Coating process according to claim 2, wherein said substrate is, at least partially, moving over one or more roller(s) and/or guiding frame(s).

46. Coating process according to claim 45, wherein said substrate is moving over at least one unwinding or supplying roller and/or one roll up or winding roller, wherein none, one or both of said roller(s) is(are) present outside said sealed zone.

47. Coating process according to claim 46, wherein said flexible substrate is passing, at least once, through said coating zone by a continuous or discontinuous motion in a forward sense.

48. Coating process according to claim 46, wherein said flexible substrate is moving in successive steps of forward and backward motion, whether or not interrupted inbetween said successive steps.

49. Coating process according to claim 45, wherein said flexible substrate is passing, at least once, through said coating zone by a continuous or discontinuous motion in a forward sense.

50. Coating process according to claim 45, wherein said flexible substrate is moving in successive steps of forward and backward motion, whether or not interrupted inbetween said successive steps.

51. Coating process according to claim 2, further comprising the step of cutting said substrate carrying said deposited phosphor or scintillator layer.

52. Coating process according to claim 2, wherein said substrate is moving over at least one unwinding or supplying roller and/or one roll up or winding roller, wherein none, one or both of said roller(s) is(are) present outside said sealed zone.

53. Coating process according to claim 52, wherein said flexible substrate is passing, at least once, through said coating zone by a continuous or discontinuous motion in a forward sense.

54. Coating process according to claim 52, wherein said flexible substrate is moving in successive steps of forward and backward motion, whether or not interrupted inbetween said successive steps.

55. Coating process according to claim 2, wherein said flexible substrate is passing, at least once, through said coating zone by a continuous or discontinuous motion in a forward sense.

56. Coating process according to claim 2, wherein said flexible substrate is moving in successive steps of forward and backward motion, whether or not interrupted inbetween said successive steps.

57. Coating process according to claim 2, wherein said substrate is a self-supporting sheet, plate, web or panel.

58. Coating process according to claim 57, wherein said metal substrate is an aluminum layer, previously coated with a protective layer being an oxide or a polymeric compound layer, present on at least a side of said substrate moving through said vapor stream.

59. Coating process according to claim 58, wherein said metal substrate is an anodized aluminum layer having a thickness of less than 600 µm.

60. Coating process according to claim 2, wherein said substrate is a roller web.

61. Coating process according to claim 60, wherein said metal substrate is an aluminum layer, previously coated with a protective layer being an oxide or a polymeric compound layer, present on at least a side of said substrate moving through said vapor stream.

62. Coating process according to claim 61, wherein said metal substrate is an anodized aluminum layer having a thickness of less than 600 µm.

63. Coating process according to claim 2, wherein said substrate is supported by a substrate holder.

64. Coating process according to claim 63, wherein said metal substrate is an aluminum layer, previously coated with a protective layer being an oxide or a polymeric compound layer, present on at least a side of said substrate moving through said vapor stream.

65. Coating process according to claim 64, wherein said metal substrate is an anodized aluminum layer having a thickness of less than 600 µm.

66. Coating process according to claim 2, wherein said metal substrate is an aluminum layer, previously coated with a protective layer being an oxide or a polymeric compound layer, present on at least a side of said substrate moving through said vapor stream.

67. Coating process according to claim 66, wherein said metal substrate is an anodized aluminum layer having a thickness of less than 600 µm.

68. Coating process according to claim 2, wherein said step of vapor deposition is initiated by a vapor flow of raw materials from one or more container(s), and wherein said vapor flow is generated by adding energy to said raw materials and said container(s), by thermal, electric, or electromagnetic energy or a combination thereof.

69. Coating process according to claim 2, wherein said step of vapor deposition proceeds by physical vapor deposition, by chemical vapor deposition or a by combination of physical and chemical vapor deposition.

70. Coating process according to claim 2, wherein said phosphor or scintillator layer is a binderless layer.

71. Coating process according to claim 2, wherein said phosphor is a photostimulable phosphor.

72. Coating process according to claim 71, wherein said photostimulable phosphor is a CsBr:Eu phosphor.

73. Coating process according to claim 2, wherein said phosphor is a prompt emitting luminescent phosphor.

74. Coating process according to claim 2, wherein said protective layer is coated or laminated onto said phosphor or scintillator layer inside said sealed zone, maintained under vacuum conditions.

75. Coating process according to claim 74, wherein said protective coating or laminate is an organic resin layer.

76. Coating process according to claim 74, wherein said protective coating or laminate is an inorganic layer.

77. Coating process according to claim 2, wherein said protective coating or laminate is an organic resin layer.

78. Coating process according to claim 2, wherein said protective coating or laminate is an inorganic layer.

79. Coating process according to claim 2, wherein said step of laminating said substrate carrying the phosphor or scintillator layer is performed inside said sealed zone, maintained under vacuum conditions.

80. Coating process according to claim 79, wherein said carrier layer is a rigid metal sheet.

81. Coating process according to claim 2, wherein said carrier layer is a rigid metal sheet.

82. Coating process according to claim 1, wherein said phosphor or scintillator layer is deposited onto an area of said flexible substrate, exceeding the area of a phosphor or scintillator screen, panel or plate ready-for-use by at least 50%.

83. Coating process according to claim 82, wherein said substrate is, at least partially, moving over one or more roller(s) and/or guiding frame(s).

84. Coating process according to claim 83, wherein said substrate is moving over at least one unwinding or supplying roller and/or one roll up or winding roller, wherein none, one or both of said roller(s) is(are) present outside said sealed zone.

85. Coating process according to claim 84, wherein said flexible substrate is passing, at least once, through said coating zone by a continuous or discontinuous motion in a forward sense.

86. Coating process according to claim 84, wherein said flexible substrate is moving in successive steps of forward and backward motion, whether or not interrupted inbetween said successive steps.

87. Coating process according to claim 83, wherein said flexible substrate is passing, at least once, through said coating zone by a continuous or discontinuous motion in a forward sense.

88. Coating process according to claim 83, wherein said flexible substrate is moving in successive steps of forward and backward motion, whether or not interrupted inbetween said successive steps.

89. Coating process according to claim 82, further comprising the step of cutting said substrate carrying said deposited phosphor or scintillator layer.

90. Coating process according to claim 82, wherein said substrate is moving over at least one unwinding or supplying roller and/or one roll up or winding roller, wherein none, one or both of said roller(s) is(are) present outside said sealed zone.

91. Coating process according to claim 90, wherein said flexible substrate is passing, at least once, through said coating zone by a continuous or discontinuous motion in a forward sense.

92. Coating process according to claim 90, wherein said flexible substrate is moving in successive steps of forward and backward motion, whether or not interrupted inbetween said successive steps.

93. Coating process according to claim 82, wherein said flexible substrate is passing, at least once, through said coating zone by a continuous or discontinuous motion in a forward sense.

94. Coating process according to claim 82, wherein said flexible substrate is moving in successive steps of forward and backward motion, whether or not interrupted inbetween said successive steps.

95. Coating process according to claim 82, wherein said substrate is a self-supporting sheet, plate, web or panel.

96. Coating process according to claim 95, wherein said metal substrate is an aluminum layer, previously coated with a protective layer being an oxide or a polymeric compound layer, present on at least a side of said substrate moving through said vapor stream.

97. Coating process according to claim 96, wherein said metal substrate is an anodized aluminum layer having a thickness of less than 600 µm.

98. Coating process according to claim 82, wherein said substrate is a roller web.

99. Coating process according to claim 98, wherein said metal substrate is an aluminum layer, previously coated with a protective layer being an oxide or a polymeric compound layer, present on at least a side of said substrate moving through said vapor stream.

100. Coating process according to claim 99, wherein said metal substrate is an anodized aluminum layer having a thickness of less than 600 µm.

101. Coating process according to claim 83, wherein said substrate is supported by a substrate holder.

102. Coating process according to claim 101, wherein said metal substrate is an aluminum layer, previously coated with a protective layer being an oxide or a polymeric compound layer, present on at least a side of said substrate moving through said vapor stream.

103. Coating process according to claim 102, wherein said metal substrate is an anodized aluminum layer having a thickness of less than 600 µm.

104. Coating process according to claim 82, wherein said metal substrate is an aluminum layer, previously coated with a protective layer being an oxide or a polymeric compound layer, present on at least a side of said substrate moving through said vapor stream.

105. Coating process according to claim 104, wherein said metal substrate is an anodized aluminum layer having a thickness of less than 600 µm.

106. Coating process according to claim 82, wherein said step of vapor deposition is initiated by a vapor flow of raw materials from one or more container(s), and wherein said vapor flow is generated by adding energy to said raw materials and said container(s), by thermal, electric, or electromagnetic energy or a combination thereof.

107. Coating process according to claim 82, wherein said step of vapor deposition proceeds by physical vapor deposition, by chemical vapor deposition or a by combination of physical and chemical vapor deposition.

108. Coating process according to claim 82, wherein said phosphor or scintillator layer is a binderless layer.

109. Coating process according to claim 82, wherein said phosphor is a photostimulable phosphor.

110. Coating process according to claim 109, wherein said photostimulable phosphor is a CsBr:Eu phosphor.

111. Coating process according to claim 82, wherein said phosphor is a prompt emitting luminescent phosphor.

112. Coating process according to claim 82, wherein said protective layer is coated or laminated onto said phosphor or scintillator layer inside said sealed zone, maintained under vacuum conditions.

113. Coating process according to claim 112, wherein said protective coating or laminate is an organic resin layer.

114. Coating process according to claim 112, wherein said protective coating or laminate is an inorganic layer.

115. Coating process according to claim 82, wherein said protective coating or laminate is an organic resin layer.

116. Coating process according to claim 82, wherein said protective coating or laminate is an inorganic layer.

117. Coating process according to claim 82, wherein said step of laminating said substrate carrying the phosphor or scintillator layer is performed inside said sealed zone, maintained under vacuum conditions.

118. Coating process according to claim 117, wherein said carrier layer is a rigid metal sheet.

119. Coating process according to claim 82, wherein said carrier layer is a rigid metal sheet.

120. Coating process according to claim 1, wherein said phosphor or scintillator layer is deposited onto an area of said flexible substrate, exceeding the area of a phosphor or scintillator screen, panel or plate ready-for-use by at least a factor of 5.

121. Coating process according to claim 120, wherein said substrate is, at least partially, moving over one or more roller(s) and/or guiding frame(s).

122. Coating process according to claim 1, wherein said phosphor or scintillator layer is deposited onto an area of said flexible substrate, exceeding the area of a phosphor or scintillator screen, panel or plate ready-for-use by at least a factor of 10.

123. Coating process according to claim 122, wherein said substrate is, at least partially, moving over one or more roller(s) and/or guiding frame(s).

124. Coating process according to claim 1, wherein said substrate is, at least partially, moving over one or more roller(s) and/or guiding frame(s).

125. Coating process according to claim 124, wherein said substrate is moving over at least one unwinding or supplying roller and/or one roll up or winding roller, wherein none, one or both of said roller(s) is(are) present outside said sealed zone.

126. Coating process according to claim 125, wherein said flexible substrate is passing, at least once, through said coating zone by a continuous or discontinuous motion in a forward sense.

127. Coating process according to claim 125, wherein said flexible substrate is moving in successive steps of forward and backward motion, whether or not interrupted inbetween said successive steps.

128. Coating process according to claim 124, wherein said flexible substrate is passing, at least once, through said coating zone by a continuous or discontinuous motion in a forward sense.

129. Coating process according to claim 124, wherein said flexible substrate is moving in successive steps of forward and backward motion, whether or not interrupted inbetween said successive steps.

130. Coating process according to claim 1, further comprising the step of cutting said substrate carrying said deposited phosphor or scintillator layer.

131. Coating process according to claim 1, wherein said substrate is moving over at least one unwinding or supplying roller and/or one roll up or winding roller, wherein none, one or both of said roller(s) is(are) present outside said sealed zone.

132. Coating process according to claim 131, wherein said flexible substrate is passing, at least once, through said coating zone by a continuous or discontinuous motion in a forward sense.

133. Coating process according to claim 131, wherein said flexible substrate is moving in successive steps of forward and backward motion, whether or not interrupted inbetween said successive steps.

134. Coating process according to claim 1, wherein said flexible substrate is passing, at least once, through said coating zone by a continuous or discontinuous motion in a forward sense.

135. Coating process according to claim 1, wherein said flexible substrate is moving in successive steps of forward and backward motion, whether or not interrupted inbetween said successive steps.

136. Coating process according to claim 1, wherein said substrate is a self-supporting sheet, plate, web or panel.

137. Coating process according to claim 136, wherein said metal substrate is an aluminum layer, previously coated with a protective layer being an oxide or a polymeric compound layer, present on at least a side of said substrate moving through said vapor stream.

138. Coating process according to claim 137, wherein said metal substrate is an anodized aluminum layer having a thickness of less than 600 µm.

139. Coating process according to claim 1, wherein said substrate is a roller web.

140. Coating process according to claim 139, wherein said metal substrate is an aluminum layer, previously coated with a protective layer being an oxide or a polymeric compound layer, present on at least a side of said substrate moving through said vapor stream.

141. Coating process according to claim 140, wherein said metal substrate is an anodized aluminum layer having a thickness of less than 600 µm.

142. Coating process according to claim 1, wherein said substrate is supported by a substrate holder.

143. Coating process according to claim 142, wherein said metal substrate is an aluminum layer, previously coated with a protective layer being an oxide or a polymeric compound layer, present on at least a side of said substrate moving through said vapor stream.

144. Coating process according to claim 143, wherein said metal substrate is an anodized aluminum layer having a thickness of less than 600 μm.

145. Coating process according to claim 1, wherein said metal substrate is an aluminum layer, previously coated with a protective layer being an oxide or a polymeric compound layer, present on at least a side of said substrate moving through said vapor stream.

146. Coating process according to claim 145, wherein said metal substrate is an anodized aluminum layer having a thickness of less than 600 μm.

147. Coating process according to claim 1, wherein said step of vapor deposition is initiated by a vapor flow of raw materials from one or more container(s), and wherein said vapor flow is generated by adding energy to said raw materials and said container(s), by thermal, electric, or electromagnetic energy or a combination thereof.

148. Coating process according to claim 1, wherein said step of vapor deposition proceeds by physical vapor deposition, by chemical vapor deposition or a by combination of physical and chemical vapor deposition.

149. Coating process according to claim 1, wherein said phosphor or scintillator layer is a binderless layer.

150. Coating process according to claim 1, wherein said phosphor is a photostimulable phosphor.

151. Coating process according to claim 150, wherein said photostimulable phosphor is a CsBr:Eu phosphor.

152. Coating process according to claim 1, wherein said phosphor is a prompt emitting luminescent phosphor.

153. Coating process according to claim 1, wherein said protective layer is coated or laminated onto said phosphor or scintillator layer inside said sealed zone, maintained under vacuum conditions.

154. Coating process according to claim 153, wherein said protective coating or laminate is an organic resin layer.

155. Coating process according to claim 153, wherein said protective coating or laminate is an inorganic layer.

156. Coating process according to claim 1, wherein said protective coating or laminate is an organic resin layer.

157. Coating process according to claim 1, wherein said protective coating or laminate is an inorganic layer.

158. Coating process according to claim 1, wherein said step of laminating said substrate carrying the phosphor or scintillator layer is performed inside said sealed zone, maintained under vacuum conditions.

159. Coating process according to claim 158, wherein said carrier layer is a rigid metal sheet.

160. Coating process according to claim 1, wherein said carrier layer is a rigid metal sheet.

* * * * *